United States Patent
Zhang et al.

(10) Patent No.: US 11,303,301 B2
(45) Date of Patent: Apr. 12, 2022

(54) CODING METHOD AND COMMUNICATIONS DEVICE

(71) Applicant: HUAWEI TECHNOLOGIES CO., LTD., Guangdong (CN)

(72) Inventors: Huazi Zhang, Hangzhou (CN); Rong Li, Hangzhou (CN); Aleksei Eduardovich Maevskii, Moscow (RU); Shengchen Dai, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/710,786

(22) Filed: Dec. 11, 2019

(65) Prior Publication Data

US 2020/0119752 A1    Apr. 16, 2020

Related U.S. Application Data

(63) Continuation of application No. PCT/CN2018/090841, filed on Jun. 12, 2018.

(30) Foreign Application Priority Data

Jun. 13, 2017  (CN) .......................... 201710449865.X

(51) Int. Cl.
  *H03M 13/13*  (2006.01)
  *H04L 1/00*   (2006.01)
  *H04L 1/16*   (2006.01)

(52) U.S. Cl.
  CPC .......... *H03M 13/13* (2013.01); *H04L 1/0043* (2013.01); *H04L 1/0061* (2013.01); *H04L 1/1621* (2013.01)

(58) Field of Classification Search
  CPC .................................................... H03M 13/13
  See application file for complete search history.

(56) References Cited

U.S. PATENT DOCUMENTS

| 8,677,227 B2 | 3/2014 | Gross et al. |
| 2012/0226956 A1 | 9/2012 | Myung et al. |

(Continued)

FOREIGN PATENT DOCUMENTS

| CN | 103023618 A | 4/2013 |
| CN | 104539393 A | 4/2015 |

(Continued)

OTHER PUBLICATIONS

NTT DoCoMo: "Distributed simple paritycheck Polar codes", 3GPP Draft; R1-1708488, May 14, 2017 (May 14, 2017), XP051273680, total 8 pages.

(Continued)

*Primary Examiner* — Joseph D Torres
(74) *Attorney, Agent, or Firm* — Womble Bond Dickinson (US) LLP

(57) ABSTRACT

Embodiments of the present invention disclose a coding method. The method in the embodiments of the present invention includes: constructing a check equation based on a correspondence between a first subchannel and a second subchannel that is in a second subchannel group, where a check bit of the check equation corresponds to the first subchannel, an information bit of the check equation corresponds to the second subchannel, the second subchannel group includes at least one second subchannel, a sequence number of the first subchannel is divided by a first preset value and a remainder is a second preset value, a sequence number of the second subchannel is divided by a third preset value and a remainder is a fourth preset value, and the sequence number of the first subchannel is greater than the sequence number of the second subchannel; and performing coding by using the check equation.

20 Claims, 5 Drawing Sheets

(56) References Cited

U.S. PATENT DOCUMENTS

2017/0366199 A1* 12/2017 Ge ..................... G06F 11/1004
2019/0215099 A1*  7/2019 Dai ..................... H03M 13/09

FOREIGN PATENT DOCUMENTS

| CN | 105680883 A | 6/2016 |
| CN | 105915318 A | 8/2016 |
| CN | 106603458 A | 4/2017 |

OTHER PUBLICATIONS

Tao Wang et al.:"Parity-Check-Concatenated Polar Codes",IEEE Communications LETTERS.,Sep. 8, 2016 (Sep. 8, 2016),pp. 2342-2345, XP055607890,total 4 pages.

* cited by examiner

Construct a check equation based on a correspondence between a first subchannel and a second subchannel that is in a second subchannel group, where a check bit of the check equation corresponds to the first subchannel, an information bit of the check equation corresponds to the second subchannel, the second subchannel group includes at least one second subchannel, the first subchannel is divided by a first preset value and a remainder is a second preset value, a sequence number of the second subchannel is divided by a third preset value and a remainder is a fourth preset value, and the sequence number of the first subchannel is greater than the sequence number of the second subchannel / 401

Perform coding by using the check equation / 402

FIG. 4

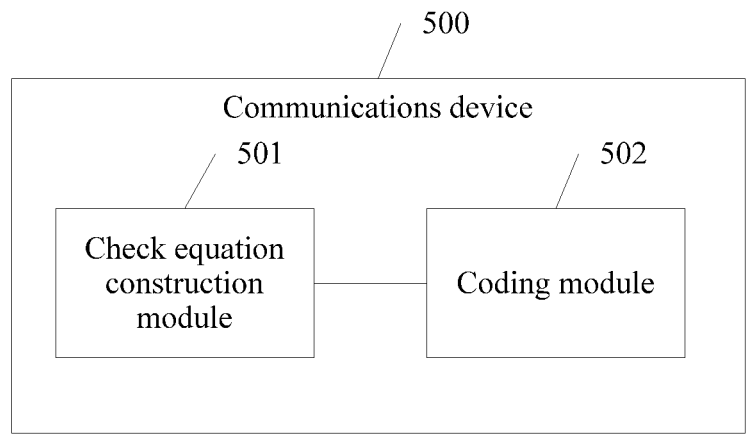

FIG. 5

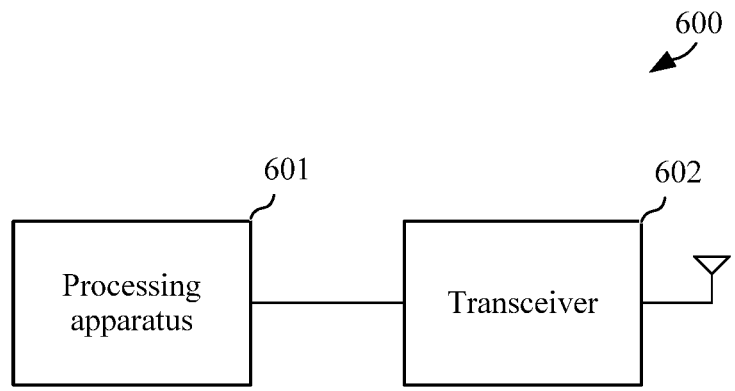

FIG. 6

CODING METHOD AND COMMUNICATIONS DEVICE

CROSS-REFERENCE TO RELATED APPLICATIONS

This application is a continuation of International Application No. PCT/CN2018/090841, filed on Jun. 12, 2018, which claims priority to Chinese Patent Application No. 201710449865.X, filed on Jun. 13, 2017. The disclosures of the aforementioned patent applications are hereby incorporated by reference in their entireties.

TECHNICAL FIELD

The present invention relates to the communications field, and in particular, to a method for determining check information in coding and a communications device.

BACKGROUND

In the field of communications field, a purpose of communication is to accurately transfer in time, information included in a message to a peer. A feature for measuring accuracy of information received on a channel is reliability, and a feature for measuring a speed of information transmission on the channel is effectiveness. Therefore, a communications system has both reliability and effectiveness. However, in an actual system, because noise exists, reliability and high speed are a paradox. Coding is a method for achieving reliability and effectively transmitting information. Currently, it is proved that polar coding is a coding method capable of achieving a channel capacity with good performance and low decoding complexity. Polar coding is a development direction of fifth generation mobile communication for channel coding in the communications system.

Currently, in a polar code scenario, no coding method is available for improving polar code performance by adding a check equation.

SUMMARY

Embodiments of the present invention provide a coding method and a communications device to provide a coding mode. To be specific, a check equation that is easy to implement is constructed, where the check equation is constructed by using a simple method and has low overheads, and the constructed check equation is used to perform coding to achieve good polar code performance. The coding method may be applied to at a transmit end, where the transmit end may be a network device, or may be a terminal.

According to a first aspect, an embodiment of this application provides a coding method, where the method includes: constructing a check equation based on a correspondence between a first subchannel and a second subchannel that is in a second subchannel group, where a check bit of the check equation corresponds to the first subchannel, an information bit of the check equation corresponds to the second subchannel, the second subchannel group includes at least one second subchannel, a sequence number of the first subchannel is divided by a first preset value and a remainder is a second preset value, a sequence number of the second subchannel is divided by a third preset value and a remainder is a fourth preset value, a position of the first subchannel corresponding to the check bit needs to be after a position of the subchannel corresponding to the information bit in the check equation, that is, the sequence number of the first subchannel is greater than the sequence number of the second subchannel, the first preset value, the second preset value, the third preset value, and the fourth preset value in this operation may be all obtained through a large amount of calculation, conclusion, and summarization and are preset, and the correspondence indicates that addition modulo 2 of at least one second subchannel corresponding to the information bit is equal to the first subchannel corresponding to the check bit, for example, u6=u2+u5, where u6 indicates the first subchannel, and u2 and u5 indicate second subchannels; and after constructing the check equation, performing coding by using the check equation. In this embodiment, positions of the check bit and the information bit in the check equation are determined based on sequence numbers of subchannels. In this application, the check equation is constructed by using a simple method, with low processing resource overheads and good polar code performance.

In one embodiment, specific method for constructing the check equation based on the correspondence between the first subchannel and the second subchannel that is in the second subchannel group may be: dividing a sequence number of each subchannel in a plurality of subchannels by the first preset value to obtain a plurality of first remainders corresponding to sequence numbers of the plurality of subchannels, and dividing the sequence number of each subchannel in the plurality of subchannels by the third preset value to obtain a plurality of second remainders corresponding to the sequence numbers of the plurality of subchannels, where it should be noted that, a time sequence of the operation of "dividing a sequence number of each subchannel in a plurality of subchannels by the first preset value" and the operation of "dividing the sequence number of each subchannel in the plurality of subchannels by the third preset value" is not limited; then determining a subchannel corresponding to a first remainder that is in the plurality of first remainders and equal to the second preset value as the first subchannel, and determining a subchannel corresponding to a second remainder that is in the plurality of second remainders and equal to the fourth preset value as the second subchannel; setting a correspondence between the first subchannel and the check bit, that is, setting the position of the check bit in the check equation, and setting a correspondence between the second subchannel and the information bit, that is, setting the position of the information bit in the check equation; and then constructing the check equation based on a correspondence between the first subchannel corresponding to the check bit and the second subchannel corresponding to the information bit. In this embodiment, the positions of the check bit and the information bit in the check equation are determined based on whether sequence numbers of subchannels satisfy a rule, where the rule is: a remainder obtained by dividing the sequence number corresponding to the check bit by the first preset value is the second preset value, and a remainder obtained by dividing the sequence number of the information bit by the third preset value is the fourth preset value, where the first preset value, the second preset value, the third preset value, and the fourth preset value are preset values. In this application, the check equation is constructed by using a simple method, with low processing resource overheads and good polar code performance.

In one embodiment, the first preset value is 2 raised to the power of n, where n is a positive integer, and n may be 3 or 4, the first preset value may be 8 or 16, and the third preset value is 2 raised to the power of m, where m may be 3 or 4, and the third preset value may also be 8 or 16.

In one embodiment, the first preset value is 8, the second preset value is 1, the third preset value is 8, and the fourth preset value is 6; or the first preset value is 8, the second preset value is 2, the third preset value is 8, and the fourth preset value is 5; or the first preset value is 16, the second preset value is 1, the third preset value is 16, and the fourth preset value includes 10, 12, and 14; or the first preset value is 16, the second preset value is 2, the third preset value is 16, and the fourth preset value includes 12 and 13; or the first preset value is 16, the second preset value is 3, the third preset value is 16, and the fourth preset value includes 12, 13, and 14; or the first preset value is 16, the second preset value is 5, the third preset value is 16, and the fourth preset value is 14.

In one embodiment, in the operation of constructing a check equation based on a correspondence between a first subchannel and a second subchannel that is in a second subchannel group, the first subchannel is a subchannel corresponding to the information bit, and in the operation of performing coding by using the check equation, the first subchannel is set as a subchannel corresponding to the check bit; and a subchannel that is in the second subchannel group and corresponds to a frozen bit is set as a subchannel corresponding to the information bit. The first subchannel corresponds to the check bit, but in the coding process, the check bit may be an information bit. In this case, the position of the information bit needs to be adjusted in the coding operation. It may be understood that, because a bit rate and a code length are determined, in all subchannels, quantities of information bits and frozen bits are definite. When the check bit is an information bit, a quantity of subchannels carrying information decreases by 1, and a frozen bit in the second subchannel group needs to be set as an information bit, to ensure that a quantity of subchannels transmitting information complies with the bit rate.

In one embodiment, a difference between a maximum value of a sequence number of a second subchannel in the second subchannel group and the sequence number of the first subchannel is less than or equal to a fifth preset value. In this case, a distance between the position of the first subchannel and the position of the second subchannel is limited to be relatively short, and the second subchannel is a second subchannel that is in the second subchannel group and is nearest to the position of the first subchannel.

In one embodiment, the fifth preset value is 3, 5, 7, or 9.

In one embodiment, in the operation of constructing a check equation based on a correspondence between a first subchannel and a second subchannel that is in a second subchannel group, the first subchannel is a subchannel corresponding to a frozen bit, and in the operation of performing coding by using the check equation, the first subchannel is set as a subchannel corresponding to the check bit. In this embodiment, if the check bit is a frozen bit, that is, if the check bit does not occupy the position of the information bit, the position of the information bit does not need to be adjusted.

In one embodiment, a threshold quantity of check bits required by a system is sometimes limited; to be specific, after a quantity of check equations are selected from constructed check equations, the selected check equations are used to perform coding; in the operation of constructing a check equation based on a correspondence between a first subchannel and a second subchannel that is in a second subchannel group, a quantity of constructed check equations is X, and the performing coding by using the check equation may be: calculating an average value of reliability of subchannels corresponding to information bits of each check equation; selecting Y check equations from the X check equations, where the average value of reliability corresponding to each of the Y check equations is less than the average value of reliability corresponding to each of (X−Y) check equations, and the (X−Y) check equations are remaining check equations after the Y check equations are selected from the X check equations; and performing coding by using the Y check equations. In this embodiment, the selected average values of reliability of information bit subchannels are relatively low, that is, bit error rates of information bit subchannels in the selected PC check equations may be high. Therefore, a probability of finding positions of error bits is increased, a large quantity of candidate paths can be obtained, reliability of information transmission is ensured, and decoding performance is improved.

In one embodiment, in the operation of constructing a check equation based on a correspondence between a first subchannel and a second subchannel that is in a second subchannel group, a quantity of constructed check equations is X, and the performing coding by using the check equation includes: determining a lowest value of reliability of subchannels corresponding to information bits of each check equation; then selecting Y check equations from the X check equations, where the lowest value of reliability corresponding to each of the Y check equations is less than the lowest value of reliability corresponding to each of (X−Y) check equations, and the (X−Y) check equations are remaining check equations after the Y check equations are selected from the X check equations; and performing coding by using the Y check equations. In this embodiment, the values of reliability of information bit subchannels that are selected are relatively low, that is, bit error rates of information bit subchannels in the selected PC check equations may be high. Therefore, a probability of finding positions of error bits is increased, a large quantity of candidate paths can be obtained, reliability of information transmission is ensured, and decoding performance is improved.

In one embodiment, in the operation of constructing a check equation based on a correspondence between a first subchannel and a second subchannel that is in a second subchannel group, a quantity of constructed check equations is X, and the performing coding by using the check equation may be: calculating an average value of sequence numbers of subchannels corresponding to information bits of each check equation; selecting Y check equations from the X check equations, where the average value of sequence numbers corresponding to each of the Y check equations is less than the average value of sequence numbers corresponding to each of (X−Y) check equations, and the (X−Y) check equations are remaining check equations after the Y check equations are selected from the X check equations; and performing coding by using the Y check equations.

In one embodiment, in the operation of constructing a check equation based on a correspondence between a first subchannel and a second subchannel that is in a second subchannel group, a quantity of constructed check equations is X, and the performing coding by using the check equation may be: calculating an average value of Hamming weights of binary sequence numbers of subchannels corresponding to information bits of each check equation; selecting Y check equations from the X check equations, where the average value of Hamming weights of binary sequence numbers corresponding to each of the Y check equations is less than the average value of Hamming weights of binary sequence numbers corresponding to each of (X−Y) check equations, and the (X−Y) check equations are remaining check equations after the Y check equations are selected from the X check equations; and performing coding by using the Y check equations.

When the quantity of check equations is limited, a plurality of manners may be provided to select the threshold quantity of check equations from the X check equations. Therefore, a quantity of application scenarios is increased.

According to a second aspect, an embodiment of this application provides a computer storage medium, configured to store a computer software instruction, where the computer storage medium includes a program designed for executing the method in the first aspect.

According to a third aspect, an embodiment of this application provides a communications device, where a function implemented by the communications device may be implemented by hardware, or may be implemented by corresponding software executed by hardware. The hardware or software includes one or more modules corresponding to the foregoing function. Specifically, the communications device includes:

a check equation construction module, configured to construct a check equation based on a correspondence between a first subchannel and a second subchannel that is in a second subchannel group, where a check bit of the check equation corresponds to the first subchannel, an information bit of the check equation corresponds to the second subchannel, the second subchannel group includes at least one second subchannel, a sequence number of the first subchannel is divided by a first preset value and a remainder is a second preset value, a sequence number of the second subchannel is divided by a third preset value and a remainder is a fourth preset value, and the sequence number of the first subchannel is greater than the sequence number of the second subchannel; and a coding module, configured to perform coding by using the check equation constructed by the check equation construction module. In this embodiment, positions of the check bit and the information bit in the check equation are determined based on sequence numbers of subchannels. In this application, the check equation is constructed by using a simple method, with low processing resource overheads and good polar code performance.

In one embodiment, the check equation construction module is specifically further configured to: divide a sequence number of each subchannel in a plurality of subchannels by the first preset value to obtain a plurality of first remainders corresponding to sequence numbers of the plurality of subchannels, and divide the sequence number of each subchannel in the plurality of subchannels by the third preset value to obtain a plurality of second remainders corresponding to the sequence numbers of the plurality of subchannels; determine a subchannel corresponding to a first remainder that is in the plurality of first remainders and equal to the second preset value as the first subchannel, and determine a subchannel corresponding to a second remainder that is in the plurality of second remainders and equal to the fourth preset value as the second subchannel; set a correspondence between the first subchannel and the check bit, and set a correspondence between the second subchannel and the information bit; and construct the check equation based on a correspondence between the first subchannel corresponding to the check bit and the second subchannel corresponding to the information bit.

In one embodiment, the first preset value is 2 raised to the power of n, the third preset value is 2 raised to the power of m, and m and n are positive integers.

In one embodiment, the first preset value is 8, the second preset value is 1, the third preset value is 8, and the fourth preset value is 6; or the first preset value is 8, the second preset value is 2, the third preset value is 8, and the fourth preset value is 5; or the first preset value is 16, the second preset value is 1, the third preset value is 16, and the fourth preset value includes 10, 12, and 14; or the first preset value is 16, the second preset value is 2, the third preset value is 16, and the fourth preset value includes 12 and 13; or the first preset value is 16, the second preset value is 3, the third preset value is 16, and the fourth preset value includes 12, 13, and 14; or the first preset value is 16, the second preset value is 5, the third preset value is 16, and the fourth preset value is 14.

In one embodiment, the coding module is further configured to: when the check equation construction module constructs the check equation, and the first subchannel is a subchannel corresponding to the information bit, set the first subchannel as a subchannel corresponding to the check bit; and set a subchannel that is in the second subchannel group and corresponds to a frozen bit as a subchannel corresponding to the information bit.

In one embodiment, a difference between a maximum value of a sequence number of a second subchannel in the second subchannel group and the sequence number of the first subchannel is less than or equal to a fifth preset value.

In one embodiment, the fifth preset value is 3, 5, 7, or 9.

In one embodiment, the coding module is further configured to: when the check equation construction module constructs the check equation, and the first subchannel is a subchannel corresponding to a frozen bit, set the first subchannel as a subchannel corresponding to the check bit.

In one embodiment, a quantity of check equations constructed by the check equation construction module is X, and the coding module is specifically further configured to: calculate an average value of reliability of subchannels corresponding to information bits of each check equation; select Y check equations from the X check equations, where the average value of reliability corresponding to each of the Y check equations is less than the average value of reliability corresponding to each of (X−Y) check equations, and the (X−Y) check equations are remaining check equations after the Y check equations are selected from the X check equations; and perform coding by using the Y check equations.

In one embodiment, a quantity of check equations constructed by the check equation construction module is X, and the coding module is specifically further configured to: determine a lowest value of reliability of subchannels corresponding to information bits of each check equation; select Y check equations from the X check equations, where the lowest value of reliability corresponding to each of the Y check equations is less than the lowest value of reliability corresponding to each of (X−Y) check equations, and the (X−Y) check equations are remaining check equations after the Y check equations are selected from the X check equations; and perform coding by using the Y check equations.

In one embodiment, a quantity of check equations constructed by the check equation construction module is X, and the coding module is specifically further configured to: calculate an average value of sequence numbers of subchannels corresponding to information bits of each check equation; select Y check equations from the X check equations, where the average value of sequence numbers corresponding to each of the Y check equations is less than the average value of sequence numbers corresponding to each of (X−Y) check equations, and the (X−Y) check equations are remaining check equations after the Y check equations are selected from the X check equations; and perform coding by using the Y check equations.

In one embodiment, a quantity of check equations constructed by the check equation construction module is X, and the coding module is specifically further configured to: calculate an average value of Hamming weights of binary sequence numbers of subchannels corresponding to information bits of each check equation; select Y check equations from the X check equations, where the average value of Hamming weights of binary sequence numbers corresponding to each of the Y check equations is less than the average value of Hamming weights of binary sequence numbers corresponding to each of (X−Y) check equations, and the (X−Y) check equations are remaining check equations after the Y check equations are selected from the X check equations; and perform coding by using the Y check equations.

According to a fourth aspect, an embodiment of this application provides a communications device, where a structure of the communications device includes a transceiver and a processing apparatus. The transceiver is connected to the processing apparatus. Specifically, the processing apparatus is configured to perform the following operations: constructing a check equation based on a correspondence between a first subchannel and a second subchannel that is in a second subchannel group, where a check bit of the check equation corresponds to the first subchannel, an information bit of the check equation corresponds to the second subchannel, the second subchannel group includes at least one second subchannel, a sequence number of the first subchannel is divided by a first preset value and a remainder is a second preset value, a sequence number of the second subchannel is divided by a third preset value and a remainder is a fourth preset value, and the sequence number of the first subchannel is greater than the sequence number of the second subchannel; and performing coding by using the check equation. In this embodiment, positions of the check bit and the information bit in the check equation are determined based on sequence numbers of subchannels. In this application, the check equation is constructed by using a simple method, with low processing resource overheads and good polar code performance.

In one embodiment, the processing apparatus is specifically further configured to: divide a sequence number of each subchannel in a plurality of subchannels by the first preset value to obtain a plurality of first remainders corresponding to sequence numbers of the plurality of subchannels, and divide the sequence number of each subchannel in the plurality of subchannels by the third preset value to obtain a plurality of second remainders corresponding to the sequence numbers of the plurality of subchannels; determine a subchannel corresponding to a first remainder that is in the plurality of first remainders and equal to the second preset value as the first subchannel, and determine a subchannel corresponding to a second remainder that is in the plurality of second remainders and equal to the fourth preset value as the second subchannel; set a correspondence between the first subchannel and the check bit, and set a correspondence between the second subchannel and the information bit; and construct the check equation based on a correspondence between the first subchannel corresponding to the check bit and the second subchannel corresponding to the information bit.

In one embodiment, the first preset value is 2 raised to the power of n, the third preset value is 2 raised to the power of m, and m and n are positive integers.

In one embodiment, the first preset value is 8, the second preset value is 1, the third preset value is 8, and the fourth preset value is 6; or the first preset value is 8, the second preset value is 2, the third preset value is 8, and the fourth preset value is 5; or the first preset value is 16, the second preset value is 1, the third preset value is 16, and the fourth preset value includes 10, 12, and 14; or the first preset value is 16, the second preset value is 2, the third preset value is 16, and the fourth preset value includes 12 and 13; or the first preset value is 16, the second preset value is 3, the third preset value is 16, and the fourth preset value includes 12, 13, and 14; or the first preset value is 16, the second preset value is 5, the third preset value is 16, and the fourth preset value is 14.

In one embodiment, the processing apparatus is further configured to: when the first subchannel is a subchannel corresponding to the information bit, set the first subchannel as a subchannel corresponding to the check bit; and set a subchannel that is in the second subchannel group and corresponds to a frozen bit as a subchannel corresponding to the information bit.

In one embodiment, a difference between a maximum value of a sequence number of a second subchannel in the second subchannel group and the sequence number of the first subchannel is less than or equal to a fifth preset value.

In one embodiment, the fifth preset value is 3, 5, 7, or 9.

In one embodiment, the processing apparatus is further configured to: when the first subchannel is a subchannel corresponding to a frozen bit, set the first subchannel as a subchannel corresponding to the check bit.

In one embodiment, a quantity of check equations constructed by the check equation construction module is X, and the processing apparatus is specifically further configured to: calculate an average value of reliability of subchannels corresponding to information bits of each check equation; select Y check equations from the X check equations, where the average value of reliability corresponding to each of the Y check equations is less than the average value of reliability corresponding to each of (X−Y) check equations, and the (X−Y) check equations are remaining check equations after the Y check equations are selected from the X check equations; and perform coding by using the Y check equations.

In one embodiment, a quantity of check equations constructed by the check equation construction module is X, and the processing apparatus is further configured to: determine a lowest value of reliability of subchannels corresponding to information bits of each check equation; select Y check equations from the X check equations, where the lowest value of reliability corresponding to each of the Y check equations is less than the lowest value of reliability corresponding to each of (X−Y) check equations, and the (X−Y) check equations are remaining check equations after the Y check equations are selected from the X check equations; and perform coding by using the Y check equations.

In one embodiment, a quantity of check equations constructed by the check equation construction module is X, and the processing apparatus is further configured to: calculate an average value of sequence numbers of subchannels corresponding to information bits of each check equation; select Y check equations from the X check equations, where the average value of sequence numbers corresponding to each of the Y check equations is less than the average value of sequence numbers corresponding to each of (X−Y) check equations, and the (X−Y) check equations are remaining check equations after the Y check equations are selected from the X check equations; and perform coding by using the Y check equations.

In one embodiment, a quantity of check equations constructed by the check equation construction module is X, and the processing apparatus further calculates an average value of Hamming weights of binary sequence numbers of subchannels corresponding to information bits of each check equation; selects Y check equations from the X check equations, where the average value of Hamming weights of binary sequence numbers corresponding to each of the Y check equations is less than the average value of Hamming weights of binary sequence numbers corresponding to each of (X−Y) check equations, and the (X−Y) check equations are remaining check equations after the Y check equations are selected from the X check equations; and performs coding by using the Y check equations.

According to a fifth aspect, an embodiment of this application provides a coding method, where the coding method is: constructing a check equation based on a correspondence between a first subchannel and a second subchannel that is in a second subchannel group, where a check bit of the check equation corresponds to the first subchannel, an information bit of the check equation corresponds to the second subchannel, the second subchannel group includes at least one second subchannel, an eigenvalue of a sequence number of the first subchannel is a first preset value, and/or an eigenvalue of a sequence number of the second subchannel is a second preset value, the sequence number of the first subchannel corresponds to the sequence number of the second subchannel, the eigenvalue is a combination of values corresponding to any M bits in a total quantity of bits of the sequence number, M is an integer, and M is less than or equal to the total quantity of bits; and then performing coding by using the check equation. In this embodiment, positions of a check bit and an information bit in a PC check equation may be determined based on binary sequence numbers of subchannels, a first subchannel corresponding to the check bit and a second subchannel corresponding to the information bit are determined, and a check equation is constructed based on the first subchannel and the second subchannel. In this embodiment, whether a sequence number in a binary form satisfies the preset rule is determined. This facilitates hardware implementation, improves processing efficiency, and has low overheads.

In one embodiment, a specific method for constructing the check equation based on the correspondence between the first subchannel and the second subchannel that is in the second subchannel group may be: when the sequence number of the first subchannel is represented in binary notation, matching a binary sequence number of each subchannel in a plurality of subchannels with a preset rule, where the preset rule is obtained through conclusion and summarization after a large amount of calculation is performed and results are checked, and specifically the preset rule is: an eigenvalue of a binary sequence number of the first subchannel is the first preset value, and/or an eigenvalue of a binary sequence number of the second subchannel is the second preset value, and the sequence number of the first subchannel corresponds to the sequence number of the second subchannel; then determining subchannels corresponding to binary sequence numbers that comply with the preset rule as the first subchannel and the second subchannel; setting a correspondence between the first subchannel and the check bit, and setting a correspondence between the second subchannel and the information bit; constructing the check equation based on a correspondence between the first subchannel corresponding to the check bit and the second subchannel corresponding to the information bit; and performing coding by using the check equation. In this embodiment, positions of a check bit and an information bit in a PC check equation may be determined based on binary sequence numbers of subchannels, a first subchannel corresponding to the check bit and a second subchannel corresponding to the information bit are determined, and a check equation is constructed based on the first subchannel and the second subchannel. In this embodiment, whether a sequence number in a binary form satisfies the preset rule is calculated. This facilitates hardware implementation, improves processing efficiency, and has low overheads.

In one embodiment, when the sequence number of the first subchannel and the sequence number of the second subchannel are represented in decimal notation, the correspondence is that a difference between a decimal sequence number of the first subchannel and a decimal sequence number of the second subchannel is a third preset value; or when the sequence number of the first subchannel and the sequence number of the second subchannel are represented in binary notation, the correspondence is that a difference between a binary sequence number of the first subchannel and a binary sequence number of the second subchannel is a fourth preset value.

In one embodiment, when the sequence number of the first subchannel and the sequence number of the second subchannel are represented in binary notation, an eigenvalue of the binary sequence number of the first subchannel is values of n least significant bits of the binary sequence number of the first subchannel, an eigenvalue of the binary sequence number of the second subchannel is values of m least significant bits of the sequence number of the second subchannel, n and m are positive integers, and n and m are quantities of bits obtained in succession in a direction of a most significant bit by using a least significant bit as a start position.

In one embodiment, when the sequence number of the first subchannel and the sequence number of the second subchannel are represented in decimal notation, the correspondence is that the difference between the decimal sequence number of the first subchannel and the decimal sequence number of the second subchannel is the third preset value, or when the sequence number of the first subchannel and the sequence number of the second subchannel are represented in binary notation, the eigenvalue of the binary sequence number of the first subchannel is least significant bits of the binary sequence number of the first subchannel, and the eigenvalue of the binary sequence number of the second subchannel is least significant bits of the binary sequence number of the second subchannel; and specifically, the first preset value, the second preset value, and the third preset value are as follows: the least significant bits of the binary sequence number of the first subchannel are [0 0 1], and/or the least significant bits of the binary sequence number of the second subchannel are [1 1 0], and the difference between the decimal sequence number of the first subchannel and the decimal sequence number of the second subchannel is 3; or the least significant bits of the binary sequence number of the first channel are [0 1 0], and/or the least significant bits of the binary sequence number of the second subchannel are [1 0 1], and the difference between the decimal sequence number of the first subchannel and the decimal sequence number of the second subchannel is 5; or the least significant bits of the binary sequence number of the first channel are [0 0 0 1], and/or the least significant bits of the binary sequence numbers of the second subchannels are [1 0 1 0], [1 1 0 0], and [1 1 1 0], and the differences between the decimal sequence number of the first subchannel and the decimal sequence numbers of the second subchannels are 7, 5, and 3 respectively; or the least significant bits of the binary sequence number of the first channel are [0 0 1 0], and/or the least significant bits of the binary sequence numbers of the second subchannels are [1 1 0 0] and [1 1 0 1], and the differences between the decimal sequence number of the first subchannel and the decimal sequence numbers of the second subchannels are 6 and 5 respectively; or the least significant bits of the binary sequence number of the first channel are [0 0 1 1], and/or the least significant bits of the binary sequence numbers of the second subchannels are [1 1 0 0], [1 1 0 1], and [1 1 1 0], and the differences between the decimal sequence number of the first subchannel and the decimal sequence numbers of the second subchannels are 7, 6, and 5 respectively; or the least significant bits of the binary sequence number of the first channel are [0 1 0 1], and/or the least significant bits of the binary sequence number of the second subchannel are [1 1 1 0], and the difference between the decimal sequence number of the first subchannel and the decimal sequence number of the second subchannel is 7. In this embodiment, coding is performed by using the check equation. In this embodiment, positions of a check bit and an information bit in a PC check equation may be determined based on binary sequence numbers of subchannels, a first subchannel corresponding to the check bit and a second subchannel corresponding to the information bit are determined, and a check equation is constructed based on the first subchannel and the second subchannel. In this embodiment, whether a sequence number in a binary form satisfies the preset rule is calculated. This facilitates hardware implementation, improves processing efficiency, and has low overheads.

In one embodiment, the sequence number of the first subchannel and the sequence number of the second subchannel in the correspondence may also be represented in a binary form; when the sequence number of the first subchannel and the sequence number of the second subchannel are represented in binary notation, the correspondence is that the difference between the binary sequence number of the first subchannel and the binary sequence number of the second subchannel is the fourth preset value, the eigenvalue of the binary sequence number of the first subchannel is least significant bits of the binary sequence number of the first subchannel, and the eigenvalue of the binary sequence number of the second subchannel is least significant bits of the binary sequence number of the second subchannel; and specifically, the preset rule, and the first preset value, the second preset value, and the fourth preset value in the preset rule are as follows: the least significant bits of the binary sequence number of the first subchannel are [0 0 1], and/or the least significant bits of the binary sequence number of the second subchannel are [1 1 0], and the difference between the binary sequence number of the first subchannel and the binary sequence number of the second subchannel is [0 1 1]; or the least significant bits of the binary sequence number of the first channel are [0 1 0], and/or the least significant bits of the binary sequence number of the second subchannel are [1 0 1], and the difference between the binary sequence number of the first subchannel and the binary sequence number of the second subchannel is [1 0 1]; or the least significant bits of the binary sequence number of the first channel are [0 0 0 1], and/or the least significant bits of the binary sequence numbers of the second subchannels are [1 0 1 0], [1 1 0 0], and [1 1 1 0], and the differences between the binary sequence number of the first subchannel and the binary sequence numbers of the second subchannels are [1 1 1], [1 0 1], and [0 1 1] respectively; or the least significant bits of the binary sequence number of the first channel are [0 0 1 0], and/or the least significant bits of the binary sequence numbers of the second subchannels are [1 1 0 0] and [1 1 0 1], and the differences between the binary sequence number of the first subchannel and the binary sequence numbers of the second subchannels are [1 1 0] and [1 0 1] respectively; or the least significant bits of the binary sequence number of the first channel are [0 0 1 1], and/or the least significant bits of the binary sequence numbers of the second subchannels are [1 1 0 0], [1 1 0 1], and [1 1 1 0], and the differences between the binary sequence number of the first subchannel and the binary sequence numbers of the second subchannels are [1 1 1], [1 1 0], and [1 0 1] respectively; or the least significant bits of the binary sequence number of the first channel are [0 1 0 1], and/or the least significant bits of the binary sequence number of the second subchannel are [1 1 1 0], and the difference between the binary sequence number of the first subchannel and the binary sequence number of the second subchannel is [1 1 1].

In one embodiment, in the operation of constructing a check equation based on a correspondence between a first subchannel and a second subchannel that is in a second subchannel group, the first subchannel is a subchannel corresponding to the information bit, and in the operation of performing coding by using the check equation, the first subchannel is set as a subchannel corresponding to the check bit; and a subchannel that is in the second subchannel group and corresponds to a frozen bit is set as a subchannel corresponding to the information bit. The first subchannel corresponds to the check bit, but in the coding process, the check bit may be an information bit. In this case, the position of the information bit needs to be adjusted in the coding operation. It may be understood that, because a bit rate and a code length are determined, in all subchannels, quantities of information bits and frozen bits are definite. When the check bit is an information bit, a quantity of subchannels carrying information decreases by 1, and a frozen bit in the second subchannel group needs to be set as an information bit, to ensure that a quantity of subchannels transmitting information complies with the bit rate.

In one embodiment, a difference between a maximum value of a sequence number of a second subchannel in the second subchannel group and the sequence number of the first subchannel is less than or equal to a fifth preset value. In this case, a distance between the position of the check bit and the position of the second subchannel is limited to be relatively short, and the second subchannel is a second subchannel that is in the second subchannel group and is nearest to the position of the first subchannel.

In one embodiment, the fifth preset value is 3, 5, 7, or 9.

In one embodiment, in the operation of constructing a check equation based on a correspondence between a first subchannel and a second subchannel that is in a second subchannel group, the first subchannel is a subchannel corresponding to a frozen bit, and in the operation of performing coding by using the check equation, the first subchannel is set as a subchannel corresponding to the check bit. In this embodiment, if the check bit is a frozen bit, that is, if the check bit does not occupy the position of the information bit, the position of the information bit does not need to be adjusted.

In one embodiment, a threshold quantity of check bits required by a system is sometimes limited; to be specific, after a quantity of check equations are selected from constructed check equations, the selected check equations are used to perform coding; in the operation of constructing a check equation based on a correspondence between a first subchannel and a second subchannel that is in a second subchannel group, a quantity of constructed check equations is X, and the performing coding by using the check equation may be: calculating an average value of reliability of subchannels corresponding to information bits of each check equation; selecting Y check equations from the X check equations, where the average value of reliability corresponding to each of the Y check equations is less than the average value of reliability corresponding to each of (X−Y) check equations, and the (X−Y) check equations are remaining check equations after the Y check equations are selected from the X check equations; and performing coding by using the Y check equations. In this embodiment, the selected average values of reliability of information bit subchannels are relatively low, that is, bit error rates of information bit subchannels in the selected PC check equations may be high. Therefore, a probability of finding positions of error bits is increased, a large quantity of candidate paths can be obtained, reliability of information transmission is ensured, and decoding performance is improved.

In one embodiment, a threshold quantity of check bits required by a system is sometimes limited; to be specific, after a quantity of check equations are selected from constructed check equations, the selected check equations are used to perform coding; another manner is provided for selecting a check equation: in the operation of constructing a check equation based on a correspondence between a first subchannel and a second subchannel that is in a second subchannel group, a quantity of constructed check equations is X, and the performing coding by using the check equation is specifically: determining a lowest value of reliability of subchannels corresponding to information bits of each check equation; selecting Y check equations from the X check equations, where the lowest value of reliability corresponding to each of the Y check equations is less than the lowest value of reliability corresponding to each of (X−Y) check equations, and the (X−Y) check equations are remaining check equations after the Y check equations are selected from the X check equations; and then performing coding by using the Y check equations. In this embodiment, the values of reliability of information bit subchannels that are selected are relatively low, that is, bit error rates of information bit subchannels in the selected PC check equations may be high. Therefore, a probability of finding positions of error bits is increased, a large quantity of candidate paths can be obtained, reliability of information transmission is ensured, and decoding performance is improved.

In one embodiment, a threshold quantity of check bits required by a system is sometimes limited; to be specific, after a quantity of check equations are selected from constructed check equations, the selected check equations are used to perform coding; another manner is provided for selecting a check equation: in the operation of constructing a check equation based on a correspondence between a first subchannel and a second subchannel that is in a second subchannel group, a quantity of constructed check equations is X, and the performing coding by using the check equation may be: calculating an average value of sequence numbers of subchannels corresponding to information bits of each check equation; selecting Y check equations from the X check equations, where the average value of sequence numbers corresponding to each of the Y check equations is less than the average value of sequence numbers corresponding to each of (X−Y) check equations, and the (X−Y) check equations are remaining check equations after the Y check equations are selected from the X check equations; and performing coding by using the Y check equations.

In one embodiment, a threshold quantity of check bits required by a system is sometimes limited; to be specific, after a quantity of check equations are selected from constructed check equations, the selected check equations are used to perform coding; another manner is further provided for selecting a check equation: in the operation of constructing a check equation based on a correspondence between a first subchannel and a second subchannel that is in a second subchannel group, a quantity of constructed check equations is X, and the performing coding by using the check equation may be: calculating an average value of Hamming weights of binary sequence numbers of subchannels corresponding to information bits of each check equation; selecting Y check equations from the X check equations, where the average value of Hamming weights of binary sequence numbers corresponding to each of the Y check equations is less than the average value of Hamming weights of binary sequence numbers corresponding to each of (X−Y) check equations, and the (X−Y) check equations are remaining check equations after the Y check equations are selected from the X check equations; and performing coding by using the Y check equations. When the quantity of check equations is limited, a plurality of manners may be provided to select the threshold quantity of check equations from the X check equations. Therefore, applicable application scenarios are increased.

According to a sixth aspect, an embodiment of this application provides a computer storage medium, configured to store a computer software instruction, where the computer storage medium includes a program designed for executing the fifth aspect.

According to a seventh aspect, an embodiment of this application provides a communications device, where the communications device includes: a check equation construction module, configured to construct a check equation based on a correspondence between a first subchannel and a second subchannel that is in a second subchannel group, where a check bit of the check equation corresponds to the first subchannel, an information bit of the check equation corresponds to the second subchannel, the second subchannel group includes at least one second subchannel, an eigenvalue of a sequence number of the first subchannel is a first preset value, and/or an eigenvalue of a sequence number of the second subchannel is a second preset value, the sequence number of the first subchannel corresponds to the sequence number of the second subchannel, the eigenvalue is a combination of values corresponding to any M bits in a total quantity of bits of the sequence number, M is an integer, and M is less than or equal to the total quantity of bits; and a coding module, configured to perform coding by using the check equation constructed by the check equation construction module.

In one embodiment, the check equation construction module is specifically further configured to: when the sequence number of the first subchannel is represented in binary notation, match a binary sequence number of each subchannel in a plurality of subchannels with a preset rule, where the preset rule is: an eigenvalue of a binary sequence number of the first subchannel is the first preset value, and/or an eigenvalue of a binary sequence number of the second subchannel is the second preset value, and the sequence number of the first subchannel corresponds to the sequence number of the second subchannel; determine subchannels corresponding to binary sequence numbers that comply with the preset rule as the first subchannel and the second subchannel; set a correspondence between the first subchannel and the check bit, and set a correspondence between the second subchannel and the information bit; and construct the check equation based on a correspondence between the first subchannel corresponding to the check bit and the second subchannel corresponding to the information bit.

In one embodiment, when the sequence number of the first subchannel and the sequence number of the second subchannel are represented in decimal notation, the correspondence is that a difference between a decimal sequence number of the first subchannel and a decimal sequence number of the second subchannel is a third preset value; or when the sequence number of the first subchannel and the sequence number of the second subchannel are represented in binary notation, the correspondence is that a difference between a binary sequence number of the first subchannel and a binary sequence number of the second subchannel is a fourth preset value.

In one embodiment, when the sequence number of the first subchannel and the sequence number of the second subchannel are represented in binary notation, an eigenvalue of the binary sequence number of the first subchannel is values of n least significant bits of the binary sequence number of the first subchannel, an eigenvalue of the binary sequence number of the second subchannel is values of m least significant bits of the sequence number of the second subchannel, n and m are positive integers, and n and m are quantities of bits obtained in succession in a direction of a most significant bit by using a least significant bit as a start position.

In one embodiment, when the sequence number of the first subchannel and the sequence number of the second subchannel are represented in decimal notation, the correspondence is that the difference between the decimal sequence number of the first subchannel and the decimal sequence number of the second subchannel is the third preset value, or when the sequence number of the first subchannel and the sequence number of the second subchannel are represented in binary notation, the eigenvalue of the binary sequence number of the first subchannel is least significant bits of the binary sequence number of the first subchannel, and the eigenvalue of the binary sequence number of the second subchannel is least significant bits of the binary sequence number of the second subchannel; and the least significant bits of the binary sequence number of the first subchannel are [0 0 1], and/or the least significant bits of the binary sequence number of the second subchannel are [1 1 0], and the difference between the decimal sequence number of the first subchannel and the decimal sequence number of the second subchannel is 3; or the least significant bits of the binary sequence number of the first channel are [0 1 0], and/or the least significant bits of the binary sequence number of the second subchannel are [1 0 1], and the difference between the decimal sequence number of the first subchannel and the decimal sequence number of the second subchannel is 5; or the least significant bits of the binary sequence number of the first channel are [0 0 0 1], and/or the least significant bits of the binary sequence numbers of the second subchannels are [1 0 1 0], [1 1 0 0], and [1 1 1 0], and the differences between the decimal sequence number of the first subchannel and the decimal sequence numbers of the second subchannels are 7, 5, and 3 respectively; or the least significant bits of the binary sequence number of the first channel are [0 0 1 0], and/or the least significant bits of the binary sequence numbers of the second subchannels are [1 1 0 0] and [1 1 0 1], and the differences between the decimal sequence number of the first subchannel and the decimal sequence numbers of the second subchannels are 6 and 5 respectively; or the least significant bits of the binary sequence number of the first channel are [0 0 1 1], and/or the least significant bits of the binary sequence numbers of the second subchannels are [1 1 0 0], [1 1 0 1], and [1 1 1 0], and the differences between the decimal sequence number of the first subchannel and the decimal sequence numbers of the second subchannels are 7, 6, and 5 respectively; or the least significant bits of the binary sequence number of the first channel are [0 1 0 1], and/or the least significant bits of the binary sequence number of the second subchannel are [1 1 1 0], and the difference between the decimal sequence number of the first subchannel and the decimal sequence number of the second subchannel is 7.

In one embodiment, when the sequence number of the first subchannel and the sequence number of the second subchannel are represented in binary notation, the correspondence is that the difference between the binary sequence number of the first subchannel and the binary sequence number of the second subchannel is the fourth preset value, the eigenvalue of the binary sequence number of the first subchannel is least significant bits of the binary sequence number of the first subchannel, and the eigenvalue of the binary sequence number of the second subchannel is least significant bits of the binary sequence number of the second subchannel; and the least significant bits of the binary sequence number of the first subchannel are [0 0 1], and/or the least significant bits of the binary sequence number of the second subchannel are [1 1 0], and the difference between the binary sequence number of the first subchannel and the binary sequence number of the second subchannel is [0 1 1]; or the least significant bits of the binary sequence number of the first channel are [0 1 0], and/or the least significant bits of the binary sequence number of the second subchannel are [1 0 1], and the difference between the binary sequence number of the first subchannel and the binary sequence number of the second subchannel is [1 0 1]; or the least significant bits of the binary sequence number of the first channel are [0 0 0 1], and/or the least significant bits of the binary sequence numbers of the second subchannels are [1 0 1 0], [1 1 0 0], and [1 1 1 0], and the differences between the binary sequence number of the first subchannel and the binary sequence numbers of the second subchannels are [1 1 1], [1 0 1], and [0 1 1] respectively; or the least significant bits of the binary sequence number of the first channel are [0 0 1 0], and/or the least significant bits of the binary sequence numbers of the second subchannels are [1 1 0 0] and [1 1 0 1], and the differences between the binary sequence number of the first subchannel and the binary sequence numbers of the second subchannels are [1 1 0] and [1 0 1] respectively; or the least significant bits of the binary sequence number of the first channel are [0 0 1 1], and/or the least significant bits of the binary sequence numbers of the second subchannels are [1 1 0 0], [1 1 0 1], and [1 1 1 0], and the differences between the binary sequence number of the first subchannel and the binary sequence numbers of the second subchannels are [1 1 1], [1 1 0], and [1 0 1] respectively; or the least significant bits of the binary sequence number of the first channel are [0 1 0 1], and/or the least significant bits of the binary sequence number of the second subchannel are [1 1 1 0], and the difference between the binary sequence number of the first subchannel and the binary sequence number of the second subchannel is [1 1 1].

In one embodiment, the coding module is further configured to: when the check equation construction module constructs the check equation, and the first subchannel is a subchannel corresponding to the information bit, set the first subchannel as a subchannel corresponding to the check bit; and set a subchannel that is in the second subchannel group and corresponds to a frozen bit as a subchannel corresponding to the information bit.

In one embodiment, a difference between a maximum value of a sequence number of a second subchannel in the second subchannel group and the sequence number of the first subchannel is less than or equal to a fifth preset value.

In one embodiment, the fifth preset value is 3, 5, 7, or 9.

In one embodiment, the coding module is further configured to: when the check equation construction module constructs the check equation, and the first subchannel is a subchannel corresponding to a frozen bit, set the first subchannel as a subchannel corresponding to the check bit.

In one embodiment, a quantity of check equations constructed by the check equation construction module is X, and the coding module is specifically further configured to: calculate an average value of reliability of subchannels corresponding to information bits of each check equation; select Y check equations from the X check equations, where the average value of reliability corresponding to each of the Y check equations is less than the average value of reliability corresponding to each of (X−Y) check equations, and the (X−Y) check equations are remaining check equations after the Y check equations are selected from the X check equations; and perform coding by using the Y check equations.

In one embodiment, a quantity of check equations constructed by the check equation construction module is X, and the coding module is specifically further configured to: determine a lowest value of reliability of subchannels corresponding to information bits of each check equation; select Y check equations from the X check equations, where the lowest value of reliability corresponding to each of the Y check equations is less than the lowest value of reliability corresponding to each of (X−Y) check equations, and the (X−Y) check equations are remaining check equations after the Y check equations are selected from the X check equations; and perform coding by using the Y check equations.

In one embodiment, a quantity of check equations constructed by the check equation construction module is X, and the coding module is specifically further configured to: calculate an average value of sequence numbers of subchannels corresponding to information bits of each check equation; select Y check equations from the X check equations, where the average value of sequence numbers corresponding to each of the Y check equations is less than the average value of sequence numbers corresponding to each of (X−Y) check equations, and the (X−Y) check equations are remaining check equations after the Y check equations are selected from the X check equations; and perform coding by using the Y check equations.

In one embodiment, a quantity of check equations constructed by the check equation construction module is X, and the coding module is specifically further configured to: calculate an average value of Hamming weights of binary sequence numbers of subchannels corresponding to information bits of each check equation; select Y check equations from the X check equations, where the average value of Hamming weights of binary sequence numbers corresponding to each of the Y check equations is less than the average value of Hamming weights of binary sequence numbers corresponding to each of (X−Y) check equations, and the (X−Y) check equations are remaining check equations after the Y check equations are selected from the X check equations; and perform coding by using the Y check equations.

According to an eighth aspect, an embodiment of the present invention provides a communications device, including a transceiver, and a processing apparatus connected to the transceiver, where the processing apparatus is configured to enable the communications device to perform the following operations: constructing a check equation based on a correspondence between a first subchannel and a second subchannel that is in a second subchannel group, where a check bit of the check equation corresponds to the first subchannel, an information bit of the check equation corresponds to the second subchannel, the second subchannel group includes at least one second subchannel, an eigenvalue of a sequence number of the first subchannel is a first preset value, and/or an eigenvalue of a sequence number of the second subchannel is a second preset value, the sequence number of the first subchannel corresponds to the sequence number of the second subchannel, the eigenvalue is a combination of values corresponding to any M bits in a total quantity of bits of the sequence number, M is an integer, and M is less than or equal to the total quantity of bits; and performing coding by using the check equation.

In one embodiment, the processing apparatus is further configured to: when the sequence number of the first subchannel is represented in binary notation, match a binary sequence number of each subchannel in a plurality of subchannels with a preset rule, where the preset rule is: an eigenvalue of a binary sequence number of the first subchannel is the first preset value, and/or an eigenvalue of a binary sequence number of the second subchannel is the second preset value, and the sequence number of the first subchannel corresponds to the sequence number of the second subchannel; determine subchannels corresponding to binary sequence numbers that comply with the preset rule as the first subchannel and the second subchannel; set a correspondence between the first subchannel and the check bit, and set a correspondence between the second subchannel and the information bit; and construct the check equation based on a correspondence between the first subchannel corresponding to the check bit and the second subchannel corresponding to the information bit.

In one embodiment, when the sequence number of the first subchannel and the sequence number of the second subchannel are represented in decimal notation, the correspondence is that a difference between a decimal sequence number of the first subchannel and a decimal sequence number of the second subchannel is a third preset value; or when the sequence number of the first subchannel and the sequence number of the second subchannel are represented in binary notation, the correspondence is that a difference between a binary sequence number of the first subchannel and a binary sequence number of the second subchannel is a fourth preset value.

In one embodiment, when the sequence number of the first subchannel and the sequence number of the second subchannel are represented in binary notation, an eigenvalue of the binary sequence number of the first subchannel is values of n least significant bits of the binary sequence number of the first subchannel, an eigenvalue of the binary sequence number of the second subchannel is values of m least significant bits of the sequence number of the second subchannel, n and m are positive integers, and n and m are quantities of bits obtained in succession in a direction of a most significant bit by using a least significant bit as a start position.

In one embodiment, when the sequence number of the first subchannel and the sequence number of the second subchannel are represented in decimal notation, the correspondence is that the difference between the decimal sequence number of the first subchannel and the decimal sequence number of the second subchannel is the third preset value, or when the sequence number of the first subchannel and the sequence number of the second subchannel are represented in binary notation, the eigenvalue of the binary sequence number of the first subchannel is least significant bits of the binary sequence number of the first subchannel, and the eigenvalue of the binary sequence number of the second subchannel is least significant bits of the binary sequence number of the second subchannel; and the least significant bits of the binary sequence number of the first subchannel are [0 0 1], and/or the least significant bits of the binary sequence number of the second subchannel are [1 1 0], and the difference between the decimal sequence number of the first subchannel and the decimal sequence number of the second subchannel is 3; or the least significant bits of the binary sequence number of the first channel are [0 1 0], and/or the least significant bits of the binary sequence number of the second subchannel are [1 0 1], and the difference between the decimal sequence number of the first subchannel and the decimal sequence number of the second subchannel is 5; or the least significant bits of the binary sequence number of the first channel are [0 0 0 1], and/or the least significant bits of the binary sequence numbers of the second subchannels are [1 0 1 0], [1 1 0 0], and [1 1 1 0], and the differences between the decimal sequence number of the first subchannel and the decimal sequence numbers of the second subchannels are 7, 5, and 3 respectively; or the least significant bits of the binary sequence number of the first channel are [0 0 1 0], and/or the least significant bits of the binary sequence numbers of the second subchannels are [1 1 0 0] and [1 1 0 1], and the differences between the decimal sequence number of the first subchannel and the decimal sequence numbers of the second subchannels are 6 and 5 respectively; or the least significant bits of the binary sequence number of the first channel are [0 0 1 1], and/or the least significant bits of the binary sequence numbers of the second subchannels are [1 1 0 0], [1 1 0 1], and [1 1 1 0], and the differences between the decimal sequence number of the first subchannel and the decimal sequence numbers of the second subchannels are 7, 6, and 5 respectively; or the least significant bits of the binary sequence number of the first channel are [0 1 0 1], and/or the least significant bits of the binary sequence number of the second subchannel are [1 1 1 0], and the difference between the decimal sequence number of the first subchannel and the decimal sequence number of the second subchannel is 7.

In one embodiment, when the sequence number of the first subchannel and the sequence number of the second subchannel are represented in binary notation, the correspondence is that the difference between the binary sequence number of the first subchannel and the binary sequence number of the second subchannel is the fourth preset value, the eigenvalue of the binary sequence number of the first subchannel is least significant bits of the binary sequence number of the first subchannel, and the eigenvalue of the binary sequence number of the second subchannel is least significant bits of the binary sequence number of the second subchannel; and the least significant bits of the binary sequence number of the first subchannel are [0 0 1], and/or the least significant bits of the binary sequence number of the second subchannel are [1 1 0], and the difference between the binary sequence number of the first subchannel and the binary sequence number of the second subchannel is [0 1 1]; or the least significant bits of the binary sequence number of the first channel are [0 1 0], and/or the least significant bits of the binary sequence number of the second subchannel are [1 0 1], and the difference between the binary sequence number of the first subchannel and the binary sequence number of the second subchannel is [1 0 1]; or the least significant bits of the binary sequence number of the first channel are [0 0 0 1], and/or the least significant bits of the binary sequence numbers of the second subchannels are [1 0 1 0], [1 1 0 0], and [1 1 1 0], and the differences between the binary sequence number of the first subchannel and the binary sequence numbers of the second subchannels are [1 1 1], [1 0 1], and [0 1 1] respectively; or the least significant bits of the binary sequence number of the first channel are [0 0 1 0], and/or the least significant bits of the binary sequence numbers of the second subchannels are [1 1 0 0] and [1 1 0 1], and the differences between the binary sequence number of the first subchannel and the binary sequence numbers of the second subchannels are [1 1 0] and [1 0 1] respectively; or the least significant bits of the binary sequence number of the first channel are [0 0 1 1], and/or the least significant bits of the binary sequence numbers of the second subchannels are [1 1 0 0], [1 1 0 1], and [1 1 1 0], and the differences between the binary sequence number of the first subchannel and the binary sequence numbers of the second subchannels are [1 1 1], [1 1 0], and [1 0 1] respectively; or the least significant bits of the binary sequence number of the first channel are [0 1 0 1], and/or the least significant bits of the binary sequence number of the second subchannel are [1 1 1 0], and the difference between the binary sequence number of the first subchannel and the binary sequence number of the second subchannel is [1 1 1].

In one embodiment, the processing apparatus is further configured to: in the operation of constructing a check equation based on a correspondence between a first subchannel and a second subchannel that is in a second subchannel group, the first subchannel is a subchannel corresponding to the information bit, and in the operation of performing coding by using the check equation, set the first subchannel as a subchannel corresponding to the check bit; and set a subchannel that is in the second subchannel group and corresponds to a frozen bit as a subchannel corresponding to the information bit.

In one embodiment, a difference between a maximum value of a sequence number of a second subchannel in the second subchannel group and the sequence number of the first subchannel is less than or equal to a fifth preset value.

In one embodiment, the fifth preset value is 3, 5, 7, or 9.

In one embodiment, the processing apparatus is further configured to: in the operation of constructing a check equation based on a correspondence between a first subchannel and a second subchannel that is in a second subchannel group, the first subchannel is a subchannel corresponding to a frozen bit, and in the operation of performing coding by using the check equation, set the first subchannel as a subchannel corresponding to the check bit.

In one embodiment, the processing apparatus is further configured to: calculate an average value of reliability of subchannels corresponding to information bits of each check equation; select Y check equations from the X check equations, where the average value of reliability corresponding to each of the Y check equations is less than the average value of reliability corresponding to each of (X−Y) check equations, and the (X−Y) check equations are remaining check equations after the Y check equations are selected from the X check equations; and perform coding by using the Y check equations.

In one embodiment, the processing apparatus is further configured to: determine a lowest value of reliability of subchannels corresponding to information bits of each check equation; select Y check equations from the X check equations, where the lowest value of reliability corresponding to each of the Y check equations is less than the lowest value of reliability corresponding to each of (X−Y) check equations, and the (X−Y) check equations are remaining check equations after the Y check equations are selected from the X check equations; and perform coding by using the Y check equations.

In one embodiment, the processing apparatus is further configured to: calculate an average value of sequence numbers of subchannels corresponding to information bits of each check equation; select Y check equations from the X check equations, where the average value of sequence numbers corresponding to each of the Y check equations is less than the average value of sequence numbers corresponding to each of (X−Y) check equations, and the (X−Y) check equations are remaining check equations after the Y check equations are selected from the X check equations; and perform coding by using the Y check equations.

In one embodiment, the processing apparatus calculates an average value of Hamming weights of binary sequence numbers of subchannels corresponding to information bits of each check equation; selects Y check equations from the X check equations, where the average value of Hamming weights of binary sequence numbers corresponding to each of the Y check equations is less than the average value of Hamming weights of binary sequence numbers corresponding to each of (X−Y) check equations, and the (X−Y) check equations are remaining check equations after the Y check equations are selected from the X check equations; and performs coding by using the Y check equations.

According to a ninth aspect, an embodiment of this application further provides a computer program product including an instruction, where when the computer program product is run on a computer, the computer is enabled to perform the method in any one of the foregoing aspects.

BRIEF DESCRIPTION OF DRAWINGS

To describe the technical solutions in the embodiments of the present invention more clearly, the following briefly describes the accompanying drawings required for describing the embodiments. The accompanying drawings in the following description show merely some embodiments of the present invention, and other drawings may still be derived from these accompanying drawings.

FIG. 4 is a schematic diagram of operations in an embodiment of a coding method according to an embodiment of this application;

FIG. 5 is a schematic structural diagram of an embodiment of a communications device according to an embodiment of this application;

FIG. 6 is a schematic structural diagram of another embodiment of a communications device according to an embodiment of this application;

DESCRIPTION OF EMBODIMENTS

Embodiments of the present invention provide a coding method and provide a coding mode, that is, a method for constructing a check equation that is easy to implement, and performing coding by using the constructed check equation.

To make a person skilled in the art understand the technical solutions in the present invention better, the following clearly describes the technical solutions in the embodiments of the present invention with reference to the accompanying drawings in the embodiments of the present invention. Apparently, the described embodiments are merely some rather than all of the embodiments of the present invention. All other embodiments obtained by a person of ordinary skill in the art based on the embodiments of the present invention without creative efforts shall fall within the protection scope of the present invention.

In the specification, claims, and accompanying drawings of the present invention, the terms "first", "second", "third", "fourth", and so on (if existent) are intended to distinguish between similar objects but do not necessarily indicate a specific order or sequence. It should be understood that the termed used in such a way are interchangeable in appropriate circumstances so that the embodiments of the present invention described herein can be implemented in other orders than the order illustrated or described herein. Moreover, the terms "include", "contain" and any other variants mean to cover the non-exclusive inclusion. For example, a process, method, system, product, or device that includes a list of operations or units is not necessarily limited to those expressly listed operations or units, but may include other operations or units that are not expressly listed or are inherent to such a process, method, system, product, or device.

The following further describes specific embodiments of the present invention in detail with reference to accompanying drawings.

Figure 1:
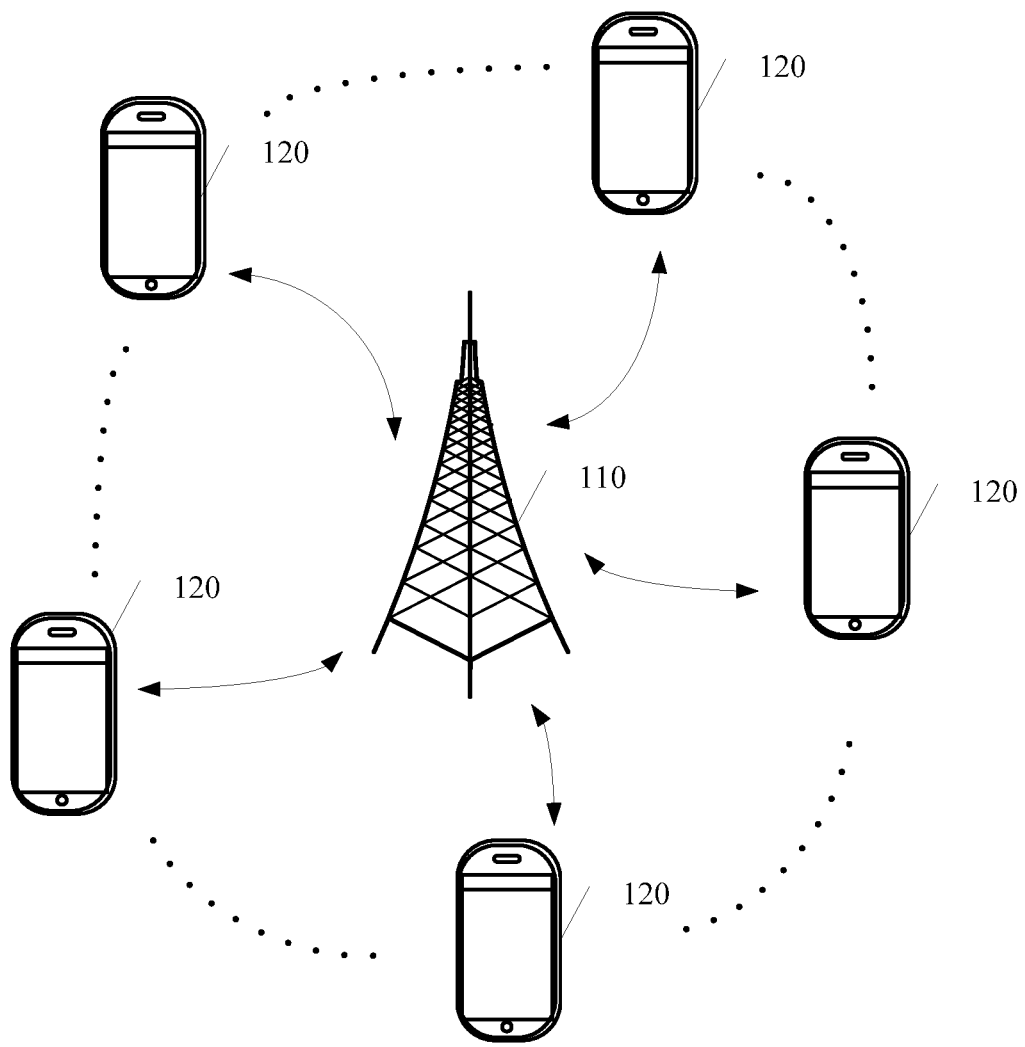
FIG. 1 is a schematic architecture diagram of a wireless communications system according to an embodiment of this application.

FIG. 1 is a schematic architecture diagram of a wireless communications system to which an embodiment of this application may be applied. The wireless communications system may include at least one network device 110, and the network device 110 communicates with one or more terminals 120. The network device may be a base station, or may be a device integrating a base station and a base station controller, or may be another device having a similar communication function.

It should be noted that, the wireless communications system mentioned in the embodiments of this application includes but is not limited to a Narrowband Internet of Things (NB-IoT) system, a global system for mobile communications (GSM), an enhanced data rate for GSM evolution (EDGE) system, a wideband code division multiple access (WCDMA) system, a code division multiple access 2000 (CDMA2000) system, a time division-synchronous code division multiple access (TD-SCDMA) system, a long term evolution (LTE) system, three application scenarios of a next-generation 5G mobile communications system, that is, eMBB, URLLC, and eMTC, or a new communications system that may appear in the future.

Terminals in the embodiments of this application may include various handheld devices, vehicle-mounted devices, wearable devices, or computing devices that have a wireless communication function, or other processing devices connected to a wireless modem. The terminal may be a mobile station (MS), a subscriber unit, a cellular phone, a smartphone, a wireless data card, a personal digital assistant (PDA) computer, a tablet computer, a wireless modem, a handheld device, a laptop computer, a machine type communications (MTC) terminal, or the like.

Figure 2:
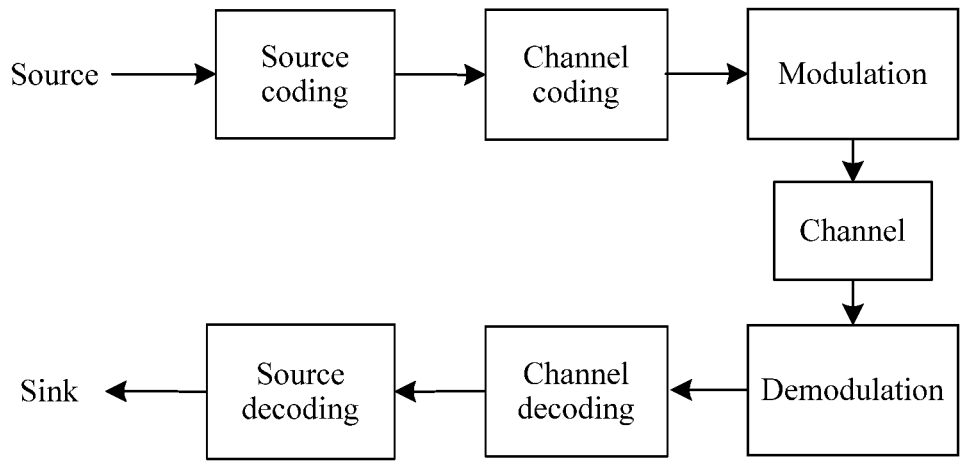
FIG. 2 is a schematic basic flowchart of performing communication by using a wireless technology according to an embodiment of this application.

A wireless technology is used for communication between the network device 110 and the terminal 120 in FIG. 1. When the network device transmits a signal, the network device is a transmit end; or when the network device receives a signal, the network device is a receive end. Likewise, when the terminal transmits a signal, the terminal is a transmit end; or when the terminal receives a signal, the terminal is a receive end. FIG. 2 is a basic process of performing communication by using a wireless technology. A source of a transmit end undergoes source coding, channel coding, rate matching, and modulation sequentially, and then is transmitted on a channel; and a receive end obtains a sink after receiving the signal and performing demodulation, de-rate matching, channel decoding, and source decoding sequentially.

Channel coding/decoding is one of core technologies in the wireless communications field, and performance improvement of the technology directly enhances network coverage and increases a user transmission rate. Currently, as proved theoretically, polar coding is a channel coding technology that can reach a Shannon limit and have a practical coding/decoding capability with linear complexity. A core of polar code construction is to enable, by using a coding method, each subchannel to present different reliability on a coder side by performing "channel polarization" processing. When a code length increases continuously, one part of channels tends to be noiseless channels whose capacities approach 1, and another part of channels tends to be pure noisy channels whose capacities approach 0. A channel whose capacity approaches 1 is selected for directly transmitting information, to approach a channel capacity.

A coding policy for a polar code exactly applies a feature of the phenomenon. The policy is intended to transmit useful information of a user by using a noiseless channel, and transmit agreed information or transmit no information by using a pure noisy channel. The polar code is also a linear block code, and its coding matrix $G_N$. A coding process is $x_1^N = u_1^N G_N$, where $u_1^N = (u_1, u_2, K, u_N)$ is a binary row vector whose length is N (that is, a code length), $G_N$ is an N×N matrix, and $G_N = F_2^{\otimes (log_2(N))}$. Herein $$F_2 = \begin{bmatrix} 1 & 0 \\ 1 & 1 \end{bmatrix},$$

and $F_2^{\otimes (log_2(N))}$ is defined as a Kronecker (Kronecker) product of $log_2 N$ matrices $F_2$.

The foregoing matrix $$F_2 = \begin{bmatrix} 1 & 0 \\ 1 & 1 \end{bmatrix}.$$

For example, when N is 8, $$F_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}; \text{ and } F_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}.$$

In a process of coding the polar code, one part of bits in $u_1^N$ are used to carry information, and are referred to as a set of information bits, where a set of indexes of the bits is denoted as A; and another part of bits are set to a fixed value pre-agreed upon between a receive end and a transmit end, and are referred to as a set of fixed bits or a set of frozen bits, where a set of indexes of the bits is indicated by a complementary set $A^c$ of A. Without loss of generality, the fixed bits are generally set to 0. However, if pre-agreed between the receive end and the transmit end, a fixed bit sequence may be set randomly. Therefore, the coded polar code that is output may be simplified as: $x_1^N = u_A G_N(A)$, where $u_A$ is the set of the information bits in $u_1^N$, $u_A$ is a row vector whose length is K, that is, $|A|=K$, $|\cdot|$ indicates a quantity of elements in the set, K is a size of an information block, $G_N(A)$ is a submatrix obtained from rows corresponding to the indexes in the set A in the matrix $G_N$, and $G_N(A)$ is a K×N matrix.

A process of constructing the polar code is a process of selecting the set A. The process determines polar code performance. The process of constructing the polar code is generally: determining, based on a code length N of a mother code, that there are a total of N polarized channels, corresponding to N rows of the coding matrix respectively; calculating reliability of the polarized channels, using indexes of first K polarized channels of higher reliability as elements of the set A, and using indexes corresponding to remaining (N−K) polarized channels as elements of the set $A^c$ of indexes of fixed bits. The set A determines positions of the information bits, and the set $A^c$ determines positions of the fixed bits.

To enhance polar code performance, in the process of constructing the polar code, that is, during coding, a check code is added. To be specific, a check bit is added after an original codeword, and a check equation is constructed, where checked by using the check bit. The check equation can not only check whether a received codeword is valid data, but also point out a position of an error bit. When the check bit and the check equation are used to decode the polar code, a large quantity of candidate paths can be obtained. Therefore, reliability of information transmission is ensured, and decoding performance is improved.

In the embodiments of this application, during coding, a check equation is constructed based on a sequence number of each polarized channel, and then the constructed check equation is used to perform coding, to enhance polar code performance.

For ease of understanding, the following explains and describes the terms used in the embodiments of this application.

Sequence number of a subchannel: A polar code whose mother code length is N corresponds to N polarized channels. In the embodiments of this application, each polarized channel is referred to as a subchannel, each subchannel corresponds to one sequence number, and a plurality of subchannels correspond to one sequence number sequence. The sequence number sequence may be represented in two manners. 1. The sequence number sequence may be a natural number sequence, for example, [0, 1, . . . , i, . . . , j, . . . , 2m−1]. 2. Alternatively, the sequence number sequence may be an integer sequence, for example, [1, 2, . . . , i, . . . , j, . . . , 2m]. In an actual application, the representation manner of the sequence number sequence is not limited. In the embodiments, the representation manner of the sequence number sequence may be described by using the first natural number sequence as an example. For example, for a polar code whose code length N is 8 and whose bit rate is 1/2, a sequence number sequence of subchannels of the polar code is [0, 1, 2, 3, 4, 5, 6, 7], where sequence numbers of subchannels corresponding to frozen bits are [0, 1, 2, 4], and sequence numbers of subchannels corresponding to information bits are [3, 5, 6, 7].

The foregoing explains an example in which a sequence number of a subchannel is represented in decimal notation. It should be noted that, a sequence number of a subchannel in the embodiments of this application may be represented in decimal notation, may be represented in binary notation, or may be represented in other notation.

For example, sequence numbers of subchannels in the embodiments of this application may be represented in binary notation. Performing binary expansion (binary expansion) on the sequence numbers of the subchannels is representing the sequence numbers of the subchannels in binary notation. For example, [0, 1, 2, 3, 4, 5, 6, 7] are represented as [(0 0 0), (0 0 1), (0 1 0), (0 1 1), (1 0 0), (1 0 1), (1 1 0), (1 1 1)] in binary notation.

Least significant bit of a value: It is a position in which a carry is generated first when the value increases. Using a binary value as an example, for example, "6" is represented as (1 1 0) in binary notation, where a least significant bit is "0". The least significant bit is relative to a most significant bit. The most significant bit is a position in which a carry is generated later when the value increases. The first "1" is the most significant bit relative to the second "1" and "0".

Least significant bits of the value: A quantity of bits obtained in succession in a direction of a most significant bit by using the least significant bit as a start position. For example, two least significant bits of (110) are "10", and three least significant bits are "110".

Check bit: It is used for correcting a bit error. The check bit may be a parity check (PC) bit or a cyclic redundancy check (CRC) bit. In the embodiments of this application, the check bit may be a parity check bit, which is used as an example for description.

Figure 3:
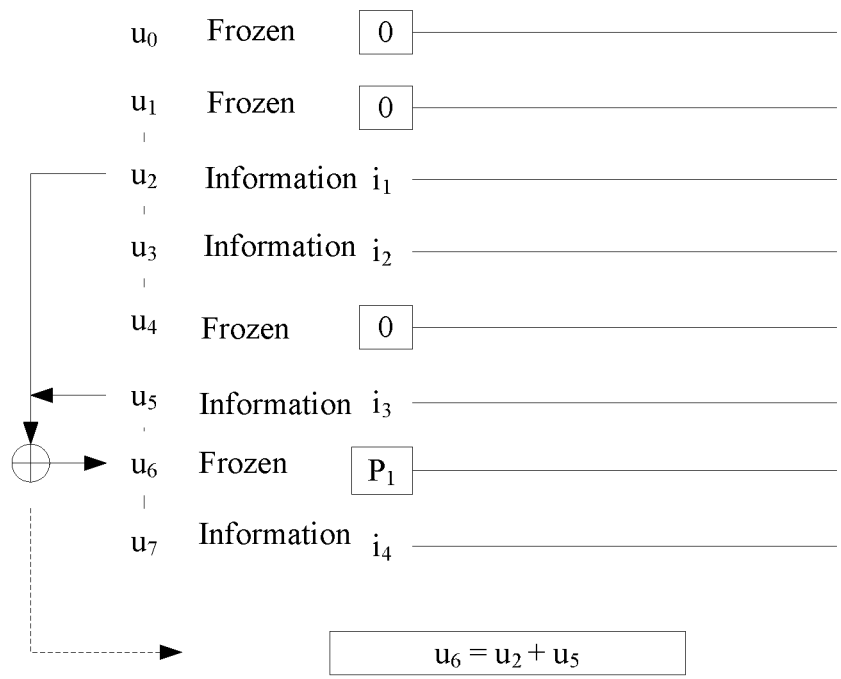
FIG. 3 is a schematic diagram of a check equation according to an embodiment of this application.

Check equation: It may be understood with reference to FIG. 3. FIG. 3 is a schematic diagram of a check equation. The check equation includes a check bit and an information bit. In the embodiments of this application, the check equation is a PC check equation, which is used as an example for description. The PC check equation includes one check bit and at least one information bit, where a sequence number of a subchannel corresponding to the check bit is represented by i, and a sequence number of a subchannel corresponding to the information bit is represented by j. One check equation includes one check bit, and the check equation may be represented by $(i_1, i_2, i_3, \ldots, j)$, where $i_1 < i_2 < i_3 \ldots < j$. A check equation must satisfy $u_{i_1} + u_{i_2} + u_{i_3} + \ldots + u_{i_{max}} = u_j$, where u represents a subchannel, $u_{i_1}$ represents a codeword of a subchannel whose sequence number is $i_1$, and so on, and "+" represents addition modulo 2.

In FIG. 3, $u_0$, $u_1$, and $u_4$ are subchannels corresponding to frozen bits, $u_2$, $u_3$, $u_5$, and $u_7$ are subchannels corresponding to information bits, and the check equation satisfies $u_6 = u_2 + u_5$. It should be noted that, FIG. 3 is only an example for describing a check equation, and the description of this application is not limited thereto.

In the embodiments of this application, a check equation is constructed based on sequence numbers of subchannels, and then coding is performed by using the constructed check equation. The following provides detailed descriptions by using different embodiments.

An embodiment of this application provides a coding method, where the coding method may be applied to a device at a transmit end, and the transmit end may be a network device, or may be a terminal.

Embodiment 1

FIG. 4 is a schematic flowchart of a coding method according to this embodiment of this application.

Operation 401: Construct a check equation based on a correspondence between a first subchannel and a second subchannel that is in a second subchannel group.

The check equation includes a check bit and an information bit. It may be understood that, to construct the check equation, a subchannel corresponding to the check bit and a subchannel corresponding to the information bit need to be determined. Each subchannel corresponds to one sequence number. To be specific, if a sequence number is determined, a corresponding subchannel is determined correspondingly.

A sequence number of each of N subchannels is matched with a first rule; and if a sequence number of the first subchannel satisfies the first rule, the first subchannel is set as a subchannel corresponding to the check bit. The first rule is: a remainder obtained by dividing the sequence number of the first subchannel by a first preset value is a second preset value.

The sequence number of each of the N subchannels is matched with a second rule, where the second subchannel group includes at least one second subchannel; and if a sequence number of the second subchannel satisfies the second rule, the second subchannel is set as a subchannel corresponding to the information bit. The second rule is: a remainder obtained by dividing the sequence number of the second subchannel by a third preset value is a fourth preset value.

Specific operations of constructing the check equation may be as follows:

(a) Determine the first subchannel, to be specific, divide the sequence number of each of the N subchannels by the first preset value to obtain a plurality of first remainders corresponding to sequence numbers of the plurality of subchannels; and determine a subchannel corresponding to a first remainder that is in the plurality of first remainders and equal to the second preset value as the first subchannel.

(b) Determine the second subchannel, to be specific, divide the sequence number of each of the N subchannels by the third preset value to obtain a plurality of second remainders corresponding to the sequence numbers of the plurality of subchannels; and determine a subchannel corresponding to a second remainder that is in the plurality of second remainders and equal to the fourth preset value as the second subchannel.

(c) Set a correspondence between the first subchannel and the check bit, and set a correspondence between the second subchannel and the information bit.

(d) Construct the check equation based on a correspondence between the first subchannel corresponding to the check bit and the second subchannel corresponding to the information bit.

The correspondence indicates that addition modulo 2 of the at least one second subchannel corresponding to the information bit is equal to the first subchannel corresponding to the check bit, for example, $u_6=u_2+u_5$, where $u_6$ indicates the first subchannel, $u_2$ and $u_5$ indicate second subchannels, 6 is the sequence number of the first subchannel, 2 is a sequence number of one second subchannel in the second subchannel group, and 5 is a sequence number of another second subchannel in the second subchannel group.

Operation a may be performed before operation b, or may be performed after operation b, or may be performed simultaneously with operation b. A time sequence of operation a and operation b is not limited.

It should be noted that, the first preset value, the second preset value, the third preset value, and the fourth preset value may be all obtained through a large amount of calculation, conclusion, and summarization, and are preset.

It may be understood that, if sequence numbers satisfying the foregoing rule are found, that is, if a sequence number of an information bit subchannel and a sequence number of a check bit subchannel for constructing the check equation are found, the subchannels corresponding to the sequence numbers may be determined, and further, the check equation is constructed.

For example, j and i are both sequence numbers of subchannels. The sequence numbers of all the subchannels are matched with the foregoing first rule. If the sequence number j is divided by the first preset value and an obtained remainder is the second preset value, a first subchannel corresponding to j is set as a subchannel corresponding to the check bit. The sequence numbers of all the subchannels are matched with the foregoing second rule. If the sequence number i is divided by the third preset value and an obtained remainder is the fourth preset value, a second subchannel corresponding to i is set as a subchannel corresponding to the information bit.

The following describes the first preset value, the second preset value, the third preset value, and the fourth preset value by using an example, as shown in the following Table 1.

TABLE 1

| | First preset value | Second preset value | Third preset value | Fourth preset value |
| --- | --- | --- | --- | --- |
| First group | 8 | 1 | 8 | 6 |
| Second group | 8 | 2 | 8 | 5 |
| Third group | 16 | 1 | 16 | 10 |
| | | | | 12 |
| | | | | 14 |
| Fourth group | 16 | 12 | 16 | 12 |
| | | | | 13 |
| Fifth group | 16 | 3 | 16 | 12 |
| | | | | 13 |
| | | | | 14 |
| Sixth group | 16 | 5 | 16 | 14 |

The first preset value, the second preset value, the third preset value, and the fourth preset value may be at least one group in the foregoing Table 1. The first preset value, the second preset value, the third preset value, and the fourth preset value in the foregoing Table 1 are used for determining the sequence number j and the sequence number i by using an example.

If a code length is 32, and the first group is used as an example for calculating values of j and i, the first preset value is 8, the second preset value is 1, the third preset value is 8, and the fourth preset value is 6.

The sequence numbers of all the subchannels are matched with the first rule, and to satisfy that a remainder is 1 after a value is divided by 8, j may be 9, 17, and 25.

The sequence numbers of all the subchannels are matched with the second rule, and to satisfy that a remainder is 6 after a value is divided by 8, i may be 14, 22, and 30.

For construction of a check equation, it needs to be satisfied that a sequence number corresponding to a check bit is greater than a sequence number corresponding to an information bit. Therefore, the following three check equations may be constructed based on the values of j and i:

When j is 9 and i1 is 6, a corresponding check equation is constructed as (6, 9), or may be represented as $u9=u6$;

when j is 17 and i1 is 14, a corresponding check equation is constructed as (14, 17), or may be represented as $u17=u14$; and when j is 25, and i1 is 14, and i2 is 22, a corresponding check equation is constructed as (14, 22, 25), or may be represented as $u25=u14+u22$.

It should be noted that, a value of the code length is an example for ease of description, and the description of this application is not limited thereto.

In the foregoing first group, for example, the fourth preset value is one value. In the following fourth group, for example, the fourth preset value includes two values.

For another example, if a code length is 64, and the fourth group is used as an example for calculating values of j and i, the first preset value is 16, the second preset value is 12, the third preset value is 16, and the fourth preset value includes 12 and 13.

The sequence numbers of all the subchannels are matched with the first rule, and to satisfy that a remainder is 12 after a value is divided by 16, j may be 28, 44, and 60.

The sequence numbers of all the subchannels are matched with the second rule, and to satisfy that a remainder is 12 after a value is divided by 16, i may be 28, 44, and 60. To satisfy that a remainder is 13 after a value is divided by 16, i may be 29, 45, and 61.

For construction of a check equation, it needs to be satisfied that a sequence number corresponding to a check bit is greater than a sequence number corresponding to an information bit. Therefore, the following two check equations may be constructed based on the values of j and i:

When j is 44, and i1 is 28, and i2 is 29, a corresponding check equation is constructed as (28, 29, 44); and when j is 60, and i1 is 28, and i2 is 29, and i3 is 44, and i4 is 45, a corresponding check equation is constructed as (28, 29, 44, 45, 60).

It should be noted that, values of the first preset value and the third preset value may be 2 raised to the power of an integer. For example, the first preset value and the third preset value may be 2, 4, 8, 16, 32, and the like. The six groups of data in the foregoing Table 1 are results concluded and summarized based on an operation law, and certainly may further include other values. Data in the foregoing Table 1 is only an example for description, and the description of this application is not limited thereto.

Specific processes of calculating j and i based on the first preset value, the second preset value, the third preset value, and the fourth preset value in the foregoing six groups are not illustrated exhaustively. Refer to similar examples of the first group and the fourth group. Details are not described again herein.

In this embodiment, positions of the check bit and the information bit in the check equation are determined based on whether sequence numbers of subchannels satisfy a rule, where the rule is: a remainder obtained by dividing the sequence number corresponding to the check bit by the first preset value is the second preset value, and a remainder obtained by dividing the sequence number of the information bit by the third preset value is the fourth preset value, where the first preset value, the second preset value, the third preset value, and the fourth preset value are preset values. In this application, the check equation is constructed by using a simple method, with low processing resource overheads and good polar code performance.

Operation 402: Perform coding by using the check equation.

In operation 401, the positions of the check bit and the information bit in the check equation can be found. To be specific, the sequence number j corresponds to the first subchannel and the sequence number i corresponds to the second subchannel. It may be understood that, in operation 401, the first subchannel corresponds to the check bit, but in the coding process, the check bit may be an information bit, or may be a frozen bit. The following separately describes a case in which the check bit is an information bit and a case in which the check bit is a frozen bit.

1. If j corresponds to a frozen bit (non-shortened bit), and there is at least one corresponding information bit in a constructed information bit set $(i_1, i_2, \ldots)$, j is set to a sequence number corresponding to the check bit, the check bit and "a part or all of information bits" in $i_1, i_2, \ldots$ jointly form a PC check equation, and a position of the information bit does not need to be adjusted. It should be noted that, in an actual system, a length of a transmitted codeword of a polar code is not necessarily 2 raised to the power of an integer. In this case, an original codeword is punctured or shortened. To be specific, on a basis of 2 raised to the power of an integer, coded bits in some positions are not transmitted, where the positions are referred to as punctured or shortened bit positions, and the positions cannot be used as PC check bit positions.

For example, the check equation constructed in operation 401 is: (28, 29, 44, 45, 60); if the sequence number 60 corresponds to a frozen bit, a first subchannel corresponding to the sequence number 60 is set as a check bit subchannel, and second subchannels corresponding to the sequence number 28, the sequence number 29, the sequence number 44, and the sequence number 45 are all information bit subchannels. In this case, the check equation (28, 29, 44, 45, 60) is used to perform coding. The check equation needs to satisfy u60=u28+u29+u44+u45.

If only a part of i1, i2, ... correspond to information bits, for example, if the sequence number 28 and the sequence number 29 both correspond to frozen bit subchannels, and the sequence number 44 and the sequence number 45 both correspond to information bit subchannels, a check equation (44, 45, 60) or (44, 60), or (45, 60) is used to perform coding.

In one embodiment, there may be a plurality of PC check equations, or the PC check equation may be further limited, to screen the PC check equation.

When the position of the information bit does not need to be adjusted, a difference between a maximum value of a corresponding sequence number in the second subchannel group and the sequence number of the first subchannel may be limited to be less than or equal to a preset value, that is, j−max(i1, i2, ... )≤da, where da is a positive integer. In one embodiment, da may be a positive integer less than 10. For example, da may be 1, 2, 3, 5, 7, 9, or the like.

2. If a first subchannel corresponding to the sequence number j is a subchannel corresponding to an information bit, the first subchannel is set as a subchannel corresponding to the check bit.

Specifically, if j corresponds to an information bit, and there is at least one frozen bit (non-shortened bit) in $i_1, i_2, \ldots$, the first subchannel corresponding to j is set as a check bit subchannel, and the check bit, "one frozen bit (non-shortened and non-PC bit) in $i_1, i_2, \ldots$, and "a part or all of information bits" jointly form a PC check equation. The frozen bit (non-shortened and non-PC bit) needs to be set as an information bit.

It may be understood that, because a bit rate and a code length are determined, in all the subchannels, quantities of information bits and frozen bits are definite. For example, for a polar code whose code length N is 16 and whose bit rate is 1/2, a quantity of frozen bits is 8, and a quantity of information bits is 8.

When j corresponds to an information bit, and j is also the check bit, a quantity of subchannels carrying information decreases by 1. To ensure that the quantity of subchannels for information transmission is still 8, one frozen bit in $i_1, i_2, \ldots$ needs to be set as an information bit.

For example, the constructed check equation is (28, 29, 44, 45, 60), where a subchannel corresponding to the sequence number 60 is an information bit subchannel, the sequence number 28 and the sequence number 29 both correspond to frozen bit subchannels, and the sequence number 44 and the sequence number 45 both correspond to information bit subchannels. In this case, after the frozen bit subchannel corresponding to the sequence number 28 or the sequence number 29 is set as an information bit subchannel, the check equation (28, 29, 44, 45, 60), that is, u60=u28+u44+u45, may be used to perform coding; or the check equation (29, 44, 45, 60), that is, u60=u29+u44+u45, is used to perform coding. It should be noted that, in this embodiment of this application, the subchannel corresponding to the information bit may be referred to as an information bit subchannel for short, the subchannel corresponding to the check bit may be referred to as a check bit subchannel for short, and the subchannel corresponding to the frozen bit may be referred to as a frozen bit subchannel for short. This is not explained again hereinafter.

When the position of the information bit needs to be adjusted, a difference between a maximum value of a corresponding sequence number in the second subchannel group and the sequence number of the first subchannel may be limited to be less than or equal to a fifth preset value, that is, j−max(i1, i2, ... )≤db, where db is a positive integer. In one embodiment, db may be a positive integer less than 10. For example, db may be 3, 5, 7, 9, or the like. In this case, a difference between j and a maximum value (imax) in a sequence number set (that is, i1, i2, ... ) of information bits are limited to be less than a preset value, so that a distance between the position of j and a position of imax is relatively short.

In one embodiment, a threshold quantity of check bits required by a system is sometimes limited. To be specific, a quantity of required check bits is less than or equal to a threshold. When a quantity of check bits is greater than the threshold, a threshold quantity of PC check equations may be selected in the following manner. Generally, the threshold may be 3, 6, or the like.

1. Select the threshold quantity of PC check equations based on an average value of reliability of subchannels corresponding to information bits of each check equation.

The quantity of check bits is X, the threshold is Y, X and Y are both positive integers, the quantity of check bits is X, each check equation corresponds to one PC check equation, and the quantity of PC check equations is also X.

An average value of reliability of subchannels corresponding to information bits of each of every X check equations is calculated; and then Y check equations are selected from the X check equations, where the average value of reliability corresponding to each of the Y check equations is less than the average value of reliability corresponding to each of (X−Y) check equations.

Specifically, the average value of reliability of subchannels corresponding to information bits of each PC check equation may be first calculated, and then the average values of reliability are sorted in ascending order, or sorted in descending order. For example, if X is 5, but the threshold is 3, three PC check equations need to be selected from five PC check equations. For example, the five PC check equations are A, B, C, D, and E respectively. Using one of the PC check equations as an example, the PC check equation A includes one check bit and three information bits, and an average value of reliability of subchannels corresponding to the three information bits is calculated, where the average value of reliability is denoted as Ar; likewise, the PC check equation B includes one check bit and two information bits, and an average value of reliability of subchannels corresponding to the two information bits is calculated, where the average value of reliability is denoted as Br; an average value of reliability of information bit subchannels corresponding to the PC check equation C is calculated, where the average value of reliability is denoted as Cr; an average value of reliability of information bit subchannels corresponding to the PC check equation D is calculated, where the average value of reliability is denoted as Dr; an average value of reliability of information bit subchannels corresponding to the PC check equation E is calculated, where the average value of reliability is denoted as Er; and the average values of reliability are sorted in ascending order as follows: Ar<Br<Cr<Dr<Er. Three PC check equations, that is, PC check equations A, B, and C, are selected in ascending order of the average values of reliability.

In one embodiment, after the average value of reliability of subchannels corresponding to information bits of each PC check equation is calculated, any two of the X average values of reliability may be compared. As long as a target average value of reliability is less than (X−threshold) average values of reliability in remaining average values of reliability, a PC check bit corresponding to the target average value of reliability is selected.

For example, any two of five average values of reliability may be compared. As long as a target average value of reliability is less than any two average values of reliability in remaining average values of reliability, a PC check equation corresponding to the target average value of reliability is selected. For example, $B_r$ is compared with $A_r$, and $B_r$ is greater than $A_r$; $B_r$ is compared with $C_r$, and $B_r$ is less than $C_r$; $B_r$ is compared with $D_r$, and $B_r$ is less than $D_r$; $B_r$ is less than two average values of reliability. In this case, the PC check equation B corresponding to $B_r$ is selected, and this method is performed until three PC check equations, that is, PC check equations A, B, and C, are selected.

Then coding is performed by using the Y check equations. In this embodiment, coding is performed by using the PC check equations A, B, and C.

In this embodiment, the selected average values of reliability of information bit subchannels are relatively low, that is, bit error rates of information bit subchannels in the selected PC check equations may be high. Therefore, a probability of finding positions of error bits is increased, a large quantity of candidate paths can be obtained, reliability of information transmission is ensured, and decoding performance is improved.

2. Select the threshold quantity of PC check equations based on a lowest value of reliability of information bit subchannels of each check equation.

A lowest value of reliability of subchannels corresponding to information bits of each of every X check equations is calculated; and then Y check equations are selected from the X check equations, where the lowest value of reliability corresponding to each of the Y check equations is less than the lowest value of reliability corresponding to each of (X−Y) check equations.

Then coding is performed by using the Y check equations.

For details, refer to the examples in the first manner, details are not described again herein.

3. Select the threshold quantity of PC check equations based on an average value (or a lowest value) of sequence numbers of information bit subchannels of each check equation.

An average value (or a lowest value) of sequence numbers of subchannels corresponding to information bits of each check equation is calculated.

Y check equations are selected from X check equations, where the average value (or lowest value) of sequence numbers corresponding to each of the Y check equations is less than the average value (or lowest value) of sequence numbers corresponding to each of (X−Y) check equations.

Then coding is performed by using the Y check equations.

Detailed descriptions of examples may be understood with reference to the first manner. Details are not described again herein.

4. Select the threshold quantity of PC check equations based on an average value (or a lowest value) of Hamming weights of binary sequence numbers of information bit subchannels of each check equation.

An average value (or a lowest value) of Hamming weights of binary sequence numbers of subchannels corresponding to information bits of each check equation is calculated.

Y check equations are selected from X check equations, where the average value (or lowest value) of Hamming weights of binary sequence numbers corresponding to each of the Y check equations is less than the average value (or lowest value) of Hamming weights of binary sequence numbers corresponding to each of (X−Y) check equations.

A Hamming weight (hw) of a sequence number of a subchannel is a quantity of 1s in binary expansion of the sequence number of the subchannel, and a row weight (rw) is 2 raised to the power of the Hamming weight of the sequence number of the subchannel, that is, $rw=2^{hw}$.

In one embodiment, when the row weights are the same, PC check equations whose average values of reliability of information bit subchannels are relatively low or whose average values of sequence numbers of subchannels are relatively low are preferentially selected.

Then coding is performed by using the Y check equations.

When the quantity of check equations is limited, a plurality of manners may be provided to select the threshold quantity of check equations from the X check equations. Therefore, applicable application scenarios are increased.

In this embodiment of this application, the positions of the check bit and the information bit in the check equation are determined based on sequence numbers of subchannels that satisfy a rule; further, the PC check equation is constructed based on the subchannel corresponding to the check bit and the subchannel corresponding to the information bit; and then coding is performed by using the constructed check equation. The check equation is constructed by using a simple method, with low overheads and good polar code performance.

Embodiment 2

In one embodiment, on a basis of the foregoing Embodiment 1, for the method for determining the positions of the check bit and the information bit for constructing the PC check equation in operation 401, this embodiment further provides another specific implementation.

In this embodiment, a sequence number of a subchannel is represented in a binary form; a binary sequence number of each of N subchannels is matched with a preset rule; and when a binary sequence number of a first subchannel and a binary sequence number of a second subchannel satisfy the preset rule, a check equation is constructed based on a correspondence between the first subchannel and the second subchannel that is in a second subchannel group. The preset rule is: an eigenvalue of the binary sequence number of the first subchannel is a first preset value, and/or an eigenvalue of the binary sequence number of the second subchannel is a second preset value, and the sequence number of the first subchannel corresponds to the sequence number of the second subchannel.

The eigenvalue is a combination of values corresponding to any M bits in L bits when a total quantity of bits included in a binary value is L, where both L and M are positive integers, and M is less than or equal to L.

For example, a binary form of "9" is (1001), L is a total quantity of bits, that is, four bits, a value corresponding to a first bit is "1", a value corresponding to a second bit is "0", a value corresponding to a third bit is "0", a value corresponding to a fourth bit is "1", and the eigenvalue may be a combination of values corresponding to last three bits in the L bits, that is, (001), or may be a combination of values corresponding to first three bits, that is, (100), or may be a combination of values corresponding to last two bits, that is, (01), or the like.

In this embodiment, the eigenvalue may be described by using least significant bits. Using (1001) as an example, a least significant bit is (1) in (1001), two least significant bits are (01) in (1001), and three least significant bits are (001) in (1001). In one embodiment, the correspondence may be that a difference between a decimal sequence number of the first subchannel and a decimal sequence number of the second subchannel is a third preset value.

Specifically, if j represents the decimal sequence number of the first subchannel, j' represents the binary sequence number of the first subchannel; and if i represents the decimal sequence number of the second subchannel, i' represents the binary sequence number of the second subchannel.

The preset rule is obtained through conclusion and summarization after a large amount of calculation is performed and results are checked. The preset rule is as follows:

(1) Least significant bits of j' are [0 0 1], and/or least significant bits of i are [1 1 0], and i=j−3.

To be specific, the least significant bits of the binary sequence number of the first subchannel are [0 0 1], and/or the least significant bits of the binary sequence number of the second subchannel are [1 1 0], and the difference between the decimal sequence number of the first subchannel and the decimal sequence number of the second subchannel is 3.

(2) Least significant bits of j' are [0 1 0], and/or least significant bits of i are [1 0 1], and i=j−5.

To be specific, the least significant bits of the binary sequence number of the first channel are [0 1 0], and/or the least significant bits of the binary sequence number of the second subchannel are [1 0 1], and the difference between the decimal sequence number of the first subchannel and the decimal sequence number of the second subchannel is 5.

(3) Least significant bits of j' are [0 0 0 1], and/or least significant bits of $i_1$' are [1 0 1 0], least significant bits of $i_2$' are [1 1 0 0], least significant bits of $i_3$' are [1 1 1 0], and $(i_1, i_2, i_3)$=(j−7, j−5, j−3).

To be specific, the least significant bits of the binary sequence number of the first channel are [0 0 0 1], and/or the least significant bits of the binary sequence numbers of the second subchannels are [1 0 1 0], [1 1 0 0], and [1 1 1 0], and the differences between the decimal sequence number of the first subchannel and the decimal sequence numbers of the second subchannels are 7, 5, and 3.

(4) Least significant bits of j' are [0 0 1 0], and/or least significant bits of $i_1$' are [1 1 0 0] and [1 1 0 1], and $(i_1, i_2)$=(j−6, j−5).

To be specific, the least significant bits of the binary sequence number of the first channel are [0 0 1 0], and/or the least significant bits of the binary sequence numbers of the second subchannels are [1 1 0 0] and [1 1 0 1], and the differences between the decimal sequence number of the first subchannel and the decimal sequence numbers of the second subchannels are 6 and 5 respectively.

(5) Least significant bits of j' are [0 0 1 1], and/or least significant bits of $i_1$' are [1 1 0 0], least significant bits of $i_2$' are [1 1 0 1], least significant bits of i3' are [1 1 1 0], and $(i_1, i_2, i_3)$=(j−7, j−6, j−5).

To be specific, the least significant bits of the binary sequence number of the first channel are [0 0 1 1], and/or the least significant bits of the binary sequence numbers of the second subchannels are [1 1 0 0], [1 1 0 1], and [1 1 1 0], and the differences between the decimal sequence number of the first subchannel and the decimal sequence numbers of the second subchannels are 7, 6, and 5 respectively.

(6) Least significant bits of j' are [0 1 0 1] and/or least significant bits of $i_1$' are [1 1 1 0], and $(i_1)$=(j−7).

To be specific, the least significant bits of the binary sequence number of the first channel are [0 1 0 1], and/or the least significant bits of the binary sequence number of the second subchannel are [1 1 1 0], and the difference between the decimal sequence number of the first subchannel and the decimal sequence number of the second subchannel is 7.

Using the foregoing rule (1) as an example, values of i and j are described by using an example.

For example, binary values of j' in which three least significant bits satisfy [0 0 1] are [0 0 1] and [1 0 0 1], where j is 1 or 9, and i needs to satisfy i=j−3; therefore, j=9, and i=6.

Alternatively, binary values of j' in which three least significant bits satisfy [1 1 0] are [1 1 0] and [1 1 1 0], where j is 6 or 14, and i needs to satisfy i=j−3; therefore, j=9, and i=6.

Calculation of j and i in the foregoing six rules is not illustrated exhaustively.

The correspondence in the preset rule is represented in a form of the difference between the decimal sequence number of the first subchannel and the decimal sequence number of the second subchannel, and the difference is the third preset value. Certainly, the correspondence between the sequence number of the first subchannel and the sequence number of the second subchannel may also be represented in a binary form. For example, the correspondence is that a difference between the binary sequence number of the first subchannel and the binary sequence number of the second subchannel is a fourth preset value. A specific example is as follows:

(1) Least significant bits of j' are [0 0 1], and/or least significant bits of i are [1 1 0], and i=j−[0 1 1].

To be specific, the least significant bits of the binary sequence number of the first subchannel are [0 0 1], and/or the least significant bits of the binary sequence number of the second subchannel are [1 1 0], and the difference between the binary sequence number of the first subchannel and the binary sequence number of the second subchannel is [0 1 1].

(2) Least significant bits of j' are [0 1 0], and/or least significant bits of i are [1 0 1], and i=j−[1 0 1].

To be specific, the least significant bits of the binary sequence number of the first channel are [0 1 0], and/or the least significant bits of the binary sequence numbers of the second subchannels are [1 0 1], and the difference between the binary sequence number of the first subchannel and the binary sequence number of the second subchannels is [1 0 1].

(3) Least significant bits of j' are [0 0 0 1], and/or least significant bits of $i_1$' are [1 0 1 0], least significant bits of $i_2$' are [1 1 0 0], least significant bits of $i_3$' are [1 1 1 0], and $(i_1, i_2, i_3)$=(j−[1 1 1], j−[1 0 1], j−[0 1 1]).

To be specific, the least significant bits of the binary sequence number of the first channel are [0 0 0 1], and/or the least significant bits of the binary sequence numbers of the second subchannels are [1 0 1 0], [1 1 0 0], and [1 1 1 0], and the differences between the binary sequence number of the first subchannel and the binary sequence numbers of the second subchannels are [1 1 1], [1 0 1], and [0 1 1] respectively.

(4) Least significant bits of j' are [0 0 1 0], and/or least significant bits of $i_1$' are [1 1 0 0] and [1 1 0 1], and $(i_1, i_2)$=(j−[1 1 0], j−[1 0 1]).

To be specific, the least significant bits of the binary sequence number of the first channel are [0 0 1 0], and/or the least significant bits of the binary sequence numbers of the second subchannels are [1 1 0 0] and [1 1 0 1], and the differences between the binary sequence number of the first subchannel and the binary sequence numbers of the second subchannels are [1 1 0] and [1 0 1] respectively.

(5) Least significant bits of j' are [0 0 1 1], and/or least significant bits of $i_1$' are [1 1 0 0], least significant bits of $i_2$' are [1 1 0 1], least significant bits of $i_3$' are [1 1 1 0], and $(i_1, i_2, i_3)$=(j−[1 1 1], j−[1 1 0], j−[1 0 1]).

To be specific, the least significant bits of the binary sequence number of the first channel are [0 0 1 1], and/or the least significant bits of the binary sequence numbers of the second subchannels are [1 1 0 0], [1 1 0 1], and [1 1 1 0], and the differences between the binary sequence number of the first subchannel and the binary sequence numbers of the second subchannels are [1 1 1], [1 1 0], and [1 0 1] respectively.

(6) Least significant bits of j' are [0 1 0 1], and/or least significant bits of $i_1$' are [1 1 1 0], and $(i_1)$=(j−[1 1 1]).

To be specific, the least significant bits of the binary sequence number of the first channel are [0 1 0 1], and/or the least significant bits of the binary sequence number of the second subchannel are [1 1 1 0], and the difference between the binary sequence number of the first subchannel and the binary sequence number of the second subchannel is [1 1 1].

In this embodiment, a operation of "performing coding by using the check equation" is the same as that in Embodiment 1, and may be understood with reference to Embodiment 1. Details are not described again herein.

In this embodiment, positions of a check bit and an information bit in a PC check equation may be determined based on binary sequence numbers of subchannels; and if the binary sequence numbers of the subchannels satisfy a preset rule, a first subchannel corresponding to the check bit and a second subchannel corresponding to the information bit are determined, and a check equation is constructed based on the first subchannel and the second subchannel. In this embodiment, whether a sequence number in a binary form satisfies the preset rule is calculated. This facilitates hardware implementation, improves processing efficiency, and has low overheads.

Embodiment 3

In one embodiment, on a basis of the foregoing Embodiment 1, for the method for constructing the PC check equation in operation 401, this embodiment further provides another specific implementation.

If a sequence number j and a sequence number i satisfy the following formula:

$$wt(gi+gj) > wt(gi) \text{ and/or } wt(gi+gj) > wt(gj), \quad \text{formula 1},$$

where i and j are natural numbers, and i<j, a PC check equation is formed by a first subchannel corresponding to j and a second subchannel corresponding to i, where $g_i$ is an $i^{th}$-row vector in a polar generation matrix $G_N$, $g_i+g_j$ is addition modulo 2 of the $i^{th}$-row vector and a $j^{th}$-row vector, and wt(g) is a quantity of 1s in a binary vector.

For example, $G_N = F_2^{\otimes (log_2(N))}$; and $$F_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}.$$

If a maximum code length is 8, all sequence numbers of j=0 to 7 are traversed, then all sequence numbers satisfying i<j are traversed, and wt($g_i+g_j$), wt($g_i$), and wt($g_j$) are calculated.

For example, for the $i^{th}$-row vector in the generation matrix $G_N$, values of i are 0, 1, 2, 3, 4, 5, 6, and 7; values of j are 0, 1, 2, 3, 4, 5, 6, and 7; when i=0, and j=2, wt($g_i+g_j$) is a quantity of 1s in addition modulo 2 of a zeroth-row vector and a first-row vector, where the zeroth-row vector is [10000000], the first-row vector is [11000000], $g_i+g_j=[01000000]$, $wt(g_0+g_1)=1$, $wt(g_0)=1$, and $wt(g_1)=2$; therefore, the sequence number 1 and the sequence number 0 do not satisfy the following formula: $wt(g_i+g_j)>wt(g_i)$ and/or $wt(g_i+g_j)>wt(g_j)$.

Based on the foregoing manner, i and j that comply with the foregoing formula 1 are found; a first subchannel corresponding to i is set as a subchannel corresponding to an information bit; and a second subchannel corresponding to j is set as a subchannel corresponding to a check bit.

In this embodiment, an operation of "performing coding by using the check equation" is the same as that in Embodiment 1, and may be understood with reference to Embodiment 1. Details are not described again herein.

In one embodiment, the first rule and the second rule in the foregoing embodiment, and the first preset value, the second preset value, the third preset value, and the fourth preset value in the first rule and the second rule are obtained through conclusion and summarization of j and i obtained by using the foregoing formula 1. Specifically, values of i and j that comply with the foregoing formula 1 may be obtained by using a computer search method. For example, if a maximum code length is 1024, all sequence numbers of j=(0 to 1023) are traversed, then all sequence numbers with i<j are traversed, and $wt(g_i+g_j)$, $wt(g_i)$, and $wt(g_j)$ are calculated; and then a combination that satisfies a requirement is selected based on "$wt(gi+gj)>wt(gi)$ and/or $wt(gi+gj)>wt(gj)$". The combination is a combination of j and i. After features of the values of j and i that comply with the formula 1 are summarized and concluded, and a large quantity of tests and verifications are performed, the first rule and the second rule in Embodiment 1 are obtained, where the first rule, the second rule, the first preset value, the second preset value, the third preset value, and the fourth preset value may be understood with reference to Embodiment 1. Details are not described again herein.

In one embodiment, binary expansion is performed on the values of j and i that comply with the formula 1; after features of binary forms of j and i are summarized and concluded, and a large quantity of tests and verifications are performed, the preset rule in Embodiment 3 and the first preset value, the second preset value, and the third preset value (or the fourth preset value) in the preset rule are obtained, where the preset rule may be understood with reference to Embodiment 2. Details are not described again herein.

The foregoing describes a coding method. The following describes a communications device to which the coding method is applied, where the communications device may be a network device, or may be a terminal. Referring to FIG. 5, an embodiment of a communications device provided by an embodiment of this application includes:

a check equation construction module 501, configured to construct a check equation based on a correspondence between a first subchannel and a second subchannel that is in a second subchannel group, where a check bit of the check equation corresponds to the first subchannel, an information bit of the check equation corresponds to the second subchannel, the second subchannel group includes at least one second subchannel, a sequence number of the first subchannel is divided by a first preset value and a remainder is a second preset value, a sequence number of the second subchannel is divided by a third preset value and a remainder is a fourth preset value, and the sequence number of the first subchannel is greater than the sequence number of the second subchannel; and a coding module 502, configured to perform coding by using the check equation constructed by the check equation construction module 501.

In one embodiment, the check equation construction module 501 is specifically further configured to:

divide a sequence number of each subchannel in a plurality of subchannels by the first preset value to obtain a plurality of first remainders corresponding to sequence numbers of the plurality of subchannels, and divide the sequence number of each subchannel in the plurality of subchannels by the third preset value to obtain a plurality of second remainders corresponding to the sequence numbers of the plurality of subchannels;

determine a subchannel corresponding to a first remainder that is in the plurality of first remainders and equal to the second preset value as the first subchannel, and determine a subchannel corresponding to a second remainder that is in the plurality of second remainders and equal to the fourth preset value as the second subchannel;

set a correspondence between the first subchannel and the check bit, and set a correspondence between the second subchannel and the information bit; and construct the check equation based on a correspondence between the first subchannel corresponding to the check bit and the second subchannel corresponding to the information bit.

In one embodiment, the first preset value is 2 raised to the power of n, the third preset value is 2 raised to the power of m, and m and n are positive integers.

In one embodiment, the first preset value is 8, the second preset value is 1, the third preset value is 8, and the fourth preset value is 6; or the first preset value is 8, the second preset value is 2, the third preset value is 8, and the fourth preset value is 5; or the first preset value is 16, the second preset value is 1, the third preset value is 16, and the fourth preset value includes 10, 12, and 14; or the first preset value is 16, the second preset value is 2, the third preset value is 16, and the fourth preset value includes 12 and 13; or the first preset value is 16, the second preset value is 3, the third preset value is 16, and the fourth preset value includes 12, 13, and 14; or the first preset value is 16, the second preset value is 5, the third preset value is 16, and the fourth preset value is 14.

In one embodiment, the coding module 502 is further configured to: when the check equation construction module 501 constructs the check equation, and the first subchannel is a subchannel corresponding to the information bit, set the first subchannel as a subchannel corresponding to the check bit; and set a subchannel that is in the second subchannel group and corresponds to a frozen bit as a subchannel corresponding to the information bit.

In one embodiment, a difference between a maximum value of a sequence number of a second subchannel in the second subchannel group and the sequence number of the first subchannel is less than or equal to a fifth preset value.

In one embodiment, the fifth preset value is 3, 5, 7, or 9.

In one embodiment, the coding module 502 is further configured to: when the check equation construction module constructs the check equation, and the first subchannel is a subchannel corresponding to a frozen bit, set the first subchannel as a subchannel corresponding to the check bit.

In one embodiment, a quantity of check equations constructed by the check equation construction module 501 is X, and the coding module 502 is specifically further configured to:

calculate an average value of reliability of subchannels corresponding to information bits of each check equation;

select Y check equations from the X check equations, where the average value of reliability corresponding to each of the Y check equations is less than the average value of reliability corresponding to each of (X−Y) check equations, and the (X−Y) check equations are remaining check equations after the Y check equations are selected from the X check equations; and perform coding by using the Y check equations.

In one embodiment, a quantity of check equations constructed by the check equation construction module 501 is X, and the coding module 502 is specifically further configured to:

determine a lowest value of reliability of subchannels corresponding to information bits of each check equation;

select Y check equations from the X check equations, where the lowest value of reliability corresponding to each of the Y check equations is less than the lowest value of reliability corresponding to each of (X−Y) check equations, and the (X−Y) check equations are remaining check equations after the Y check equations are selected from the X check equations; and perform coding by using the Y check equations.

In one embodiment, a quantity of check equations constructed by the check equation construction module 501 is X, and the coding module 502 is specifically further configured to:

calculate an average value of sequence numbers of subchannels corresponding to information bits of each check equation;

select Y check equations from the X check equations, where the average value of sequence numbers corresponding to each of the Y check equations is less than the average value of sequence numbers corresponding to each of (X−Y) check equations, and the (X−Y) check equations are remaining check equations after the Y check equations are selected from the X check equations; and perform coding by using the Y check equations.

In one embodiment, a quantity of check equations constructed by the check equation construction module 501 is X, and the coding module 502 is specifically further configured to:

calculate an average value of Hamming weights of binary sequence numbers of subchannels corresponding to information bits of each check equation;

select Y check equations from the X check equations, where the average value of Hamming weights of binary sequence numbers corresponding to each of the Y check equations is less than the average value of Hamming weights of binary sequence numbers corresponding to each of (X−Y) check equations, and the (X−Y) check equations are remaining check equations after the Y check equations are selected from the X check equations; and perform coding by using the Y check equations.

Based on a structure of the communications device shown in FIG. 5, another embodiment of a communications device provided by an embodiment of this application includes:

a check equation construction module 501, configured to construct a check equation based on a correspondence between a first subchannel and a second subchannel that is in a second subchannel group, where a check bit of the check equation corresponds to the first subchannel, an information bit of the check equation corresponds to the second subchannel, the second subchannel group includes at least one second subchannel, an eigenvalue of a sequence number of the first subchannel is a first preset value, and/or an eigenvalue of a sequence number of the second subchannel is a second preset value, the sequence number of the first subchannel corresponds to the sequence number of the second subchannel, the eigenvalue is a combination of values corresponding to any M bits in a total quantity of bits of the sequence number, M is an integer, and M is less than or equal to the total quantity of bits; and a coding module 502, configured to perform coding by using the check equation constructed by the check equation construction module 501.

In one embodiment, the check equation construction module 501 is specifically further configured to:

when the sequence number of the first subchannel is represented in binary notation, match a binary sequence number of each subchannel in a plurality of subchannels with a preset rule, where the preset rule is: an eigenvalue of a binary sequence number of the first subchannel is the first preset value, and/or an eigenvalue of a binary sequence number of the second subchannel is the second preset value, and the sequence number of the first subchannel corresponds to the sequence number of the second subchannel;

determine subchannels corresponding to binary sequence numbers that comply with the preset rule as the first subchannel and the second subchannel;

set a correspondence between the first subchannel and the check bit, and set a correspondence between the second subchannel and the information bit; and construct the check equation based on a correspondence between the first subchannel corresponding to the check bit and the second subchannel corresponding to the information bit.

In one embodiment, when the sequence number of the first subchannel and the sequence number of the second subchannel are represented in decimal notation, the correspondence is that a difference between a decimal sequence number of the first subchannel and a decimal sequence number of the second subchannel is a third preset value; or when the sequence number of the first subchannel and the sequence number of the second subchannel are represented in binary notation, the correspondence is that a difference between a binary sequence number of the first subchannel and a binary sequence number of the second subchannel is a fourth preset value.

In one embodiment, when the sequence number of the first subchannel and the sequence number of the second subchannel are represented in binary notation, an eigenvalue of the binary sequence number of the first subchannel is values of n least significant bits of the binary sequence number of the first subchannel, an eigenvalue of the binary sequence number of the second subchannel is values of m least significant bits of the sequence number of the second subchannel, n and m are positive integers, and n and m are quantities of bits obtained in succession in a direction of a most significant bit by using a least significant bit as a start position.

In one embodiment, when the sequence number of the first subchannel and the sequence number of the second subchannel are represented in decimal notation, the correspondence is that the difference between the decimal sequence number of the first subchannel and the decimal sequence number of the second subchannel is the third preset value, or when the sequence number of the first subchannel and the sequence number of the second subchannel are represented in binary notation, the eigenvalue of the binary sequence number of the first subchannel is least significant bits of the binary sequence number of the first subchannel, and the binary sequence number of the second subchannel is least significant bits of the binary sequence number of the second subchannel; and the least significant bits of the binary sequence number of the first subchannel are [0 0 1], and/or the least significant bits of the binary sequence number of the second subchannel are [1 1 0], and the difference between the decimal sequence number of the first subchannel and the decimal sequence number of the second subchannel is 3; or the least significant bits of the binary sequence number of the first channel are [0 1 0], and/or the least significant bits of the binary sequence number of the second subchannel are [1 0 1], and the difference between the decimal sequence number of the first subchannel and the decimal sequence number of the second subchannel is 5; or the least significant bits of the binary sequence number of the first channel are [0 0 0 1], and/or the least significant bits of the binary sequence numbers of the second subchannels are [1 0 1 0], [1 1 0 0], and [1 1 1 0], and the differences between the decimal sequence number of the first subchannel and the decimal sequence numbers of the second subchannels are 7, 5, and 3 respectively; or the least significant bits of the binary sequence number of the first channel are [0 0 1 0], and/or the least significant bits of the binary sequence numbers of the second subchannels are [1 1 0 0] and [1 1 0 1], and the differences between the decimal sequence number of the first subchannel and the decimal sequence numbers of the second subchannels are 6 and 5 respectively; or the least significant bits of the binary sequence number of the first channel are [0 0 1 1], and/or the least significant bits of the binary sequence numbers of the second subchannels are [1 1 0 0], [1 1 0 1], and [1 1 1 0], and the differences between the decimal sequence number of the first subchannel and the decimal sequence numbers of the second subchannels are 7, 6, and 5 respectively; or the least significant bits of the binary sequence number of the first channel are [0 1 0 1], and/or the least significant bits of the binary sequence number of the second subchannel are [1 1 1 0], and the difference between the decimal sequence number of the first subchannel and the decimal sequence number of the second subchannel is 7.

In one embodiment, when the sequence number of the first subchannel and the sequence number of the second subchannel are represented in binary notation, the correspondence is that the difference between the binary sequence number of the first subchannel and the binary sequence number of the second subchannel is the fourth preset value, the eigenvalue of the binary sequence number of the first subchannel is least significant bits of the binary sequence number of the first subchannel, and the binary sequence number of the second subchannel is least significant bits of the binary sequence number of the second subchannel; and the least significant bits of the binary sequence number of the first subchannel are [0 0 1], and/or the least significant bits of the binary sequence number of the second subchannel are [1 1 0], and the difference between the binary sequence number of the first subchannel and the binary sequence number of the second subchannel is [0 1 1]; or the least significant bits of the binary sequence number of the first channel are [0 1 0], and/or the least significant bits of the binary sequence number of the second subchannel are [1 0 1], and the difference between the binary sequence number of the first subchannel and the binary sequence number of the second subchannel is [1 0 1]; or the least significant bits of the binary sequence number of the first channel are [0 0 0 1], and/or the least significant bits of the binary sequence numbers of the second subchannels are [1 0 1 0], [1 1 0 0], and [1 1 1 0], and the differences between the binary sequence number of the first subchannel and the binary sequence numbers of the second subchannels are [1 1 1], [1 0 1], and [0 1 1] respectively; or the least significant bits of the binary sequence number of the first channel are [0 0 1 0], and/or the least significant bits of the binary sequence numbers of the second subchannels are [1 1 0 0] and [1 1 0 1], and the differences between the binary sequence number of the first subchannel and the binary sequence numbers of the second subchannels are [1 1 0] and [1 0 1] respectively; or the least significant bits of the binary sequence number of the first channel are [0 0 1 1], and/or the least significant bits of the binary sequence numbers of the second subchannels are [1 1 0 0], [1 1 0 1], and [1 1 1 0], and the differences between the binary sequence number of the first subchannel and the binary sequence numbers of the second subchannels are [1 1 1], [1 1 0], and [1 0 1] respectively; or the least significant bits of the binary sequence number of the first channel are [0 1 0 1], and/or the least significant bits of the binary sequence number of the second subchannel are [1 1 1 0], and the difference between the binary sequence number of the first subchannel and the binary sequence number of the second subchannel is [1 1 1].

In one embodiment, the coding module 502 is further configured to: when the check equation construction module 501 constructs the check equation, and the first subchannel is a subchannel corresponding to the information bit, set the first subchannel as a subchannel corresponding to the check bit; and set a subchannel that is in the second subchannel group and corresponds to a frozen bit as a subchannel corresponding to the information bit.

In one embodiment, a difference between a maximum value of a sequence number of a second subchannel in the second subchannel group and the sequence number of the first subchannel is less than or equal to a fifth preset value.

In one embodiment, the fifth preset value is 3, 5, 7, or 9.

In one embodiment, the coding module 502 is further configured to: when the check equation construction module 501 constructs the check equation, and the first subchannel is a subchannel corresponding to a frozen bit, set the first subchannel as a subchannel corresponding to the check bit.

In one embodiment, a quantity of check equations constructed by the check equation construction module 501 is X, and the coding module 502 is specifically further configured to:

calculate an average value of reliability of subchannels corresponding to information bits of each check equation;

select Y check equations from the X check equations, where the average value of reliability corresponding to each of the Y check equations is less than the average value of reliability corresponding to each of (X−Y) check equations, and the (X−Y) check equations are remaining check equations after the Y check equations are selected from the X check equations; and perform coding by using the Y check equations.

In one embodiment, a quantity of check equations constructed by the check equation construction module 501 is X, and the coding module 502 is specifically further configured to:

determine a lowest value of reliability of subchannels corresponding to information bits of each check equation;

select Y check equations from the X check equations, where the lowest value of reliability corresponding to each of the Y check equations is less than the lowest value of reliability corresponding to each of (X−Y) check equations, and the (X−Y) check equations are remaining check equations after the Y check equations are selected from the X check equations; and perform coding by using the Y check equations.

In one embodiment, a quantity of check equations constructed by the check equation construction module 501 is X, and the coding module 502 is specifically further configured to:

calculate an average value of sequence numbers of subchannels corresponding to information bits of each check equation;

select Y check equations from the X check equations, where the average value of sequence numbers corresponding to each of the Y check equations is less than the average value of sequence numbers corresponding to each of (X−Y) check equations, and the (X−Y) check equations are remaining check equations after the Y check equations are selected from the X check equations; and perform coding by using the Y check equations.

In one embodiment, a quantity of check equations constructed by the check equation construction module 501 is X, and the coding module 502 is specifically further configured to:

calculate an average value of Hamming weights of binary sequence numbers of subchannels corresponding to information bits of each check equation;

select Y check equations from the X check equations, where the average value of Hamming weights of binary sequence numbers corresponding to each of the Y check equations is less than the average value of Hamming weights of binary sequence numbers corresponding to each of (X−Y) check equations, and the (X−Y) check equations are remaining check equations after the Y check equations are selected from the X check equations; and perform coding by using the Y check equations.

Further, the communications device in FIG. 5 is presented in a form of a functional module. The "module" herein may be an application-specific integrated circuit (application-specific integrated circuit, ASIC), a circuit, a processor and a memory for executing one or more software or firmware programs, an integrated logic circuit, and/or another device that can provide the foregoing function. In a simple embodiment, the communications device in FIG. 5 may be in a form shown in FIG. 6.

Referring to FIG. 6, a communications device 600 provided by an embodiment of the present invention is configured to implement a coding function, and the communications device 600 includes:

a processing apparatus 601, configured to: construct a check equation based on a correspondence between a first subchannel and a second subchannel that is in a second subchannel group, where the check equation includes a check bit and an information bit, the check bit corresponds to the first subchannel, the information bit corresponds to the second subchannel group, the second subchannel group includes at least one second subchannel, a sequence number of the first subchannel is divided by a first preset value and a remainder is a second preset value, a sequence number of the second subchannel is divided by a third preset value and a remainder is a fourth preset value, each subchannel corresponds to a sequence number, and the sequence number of the first subchannel is greater than the sequence number of the second subchannel; and perform coding by using the check equation; and a transceiver 602, configured to receive a signal and transmit a signal, and transmit coded information to a device at a receive end.

Figure 7:
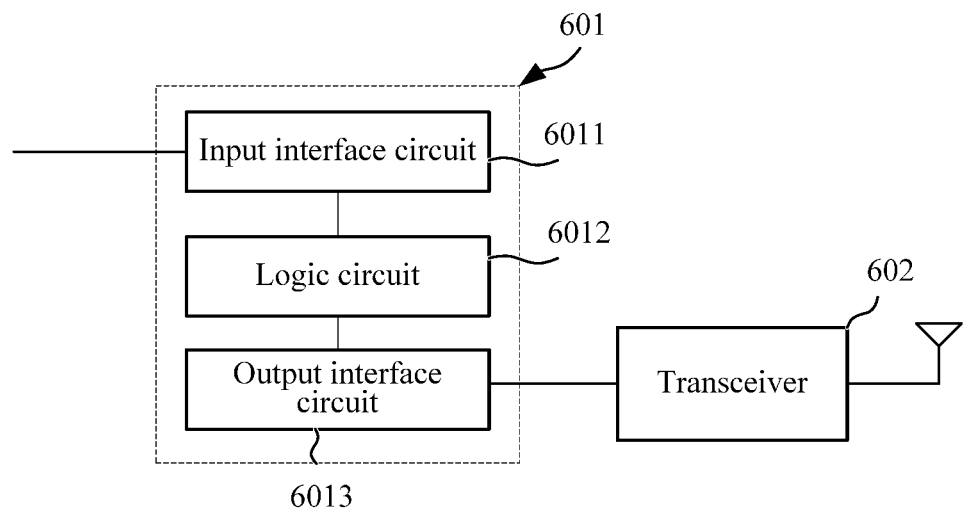
FIG. 7 is a schematic structural diagram of a processing apparatus according to an embodiment of this application.

An embodiment of the present invention further provides a coding processing apparatus 601, where the processing apparatus 601 may be implemented by hardware or may be implemented by software. When the processing apparatus is implemented by hardware, referring to FIG. 7, the processing apparatus 601 includes:

an input interface circuit 6011, configured to obtain an input information bit sequence;

a logic circuit 6012, configured to: construct a check equation based on a correspondence between a first subchannel and a second subchannel that is in a second subchannel group, where the check equation includes a check bit and an information bit, the check bit corresponds to the first subchannel, the information bit corresponds to the second subchannel group, the second subchannel group includes at least one second subchannel, a sequence number of the first subchannel is divided by a first preset value and a remainder is a second preset value, a sequence number of the second subchannel is divided by a third preset value and a remainder is a fourth preset value, each subchannel corresponds to a sequence number, and the sequence number of the first subchannel is greater than the sequence number of the second subchannel; and perform coding by using the check equation; and an output interface circuit 6013, configured to output an information bit sequence.

The logic circuit 6012 may be configured to perform the coding method shown in FIG. 4. For details, refer to the descriptions in the foregoing method embodiment. Details are not described again herein. In a specific implementation, the processing apparatus may be a chip or an integrated circuit.

Figure 8:
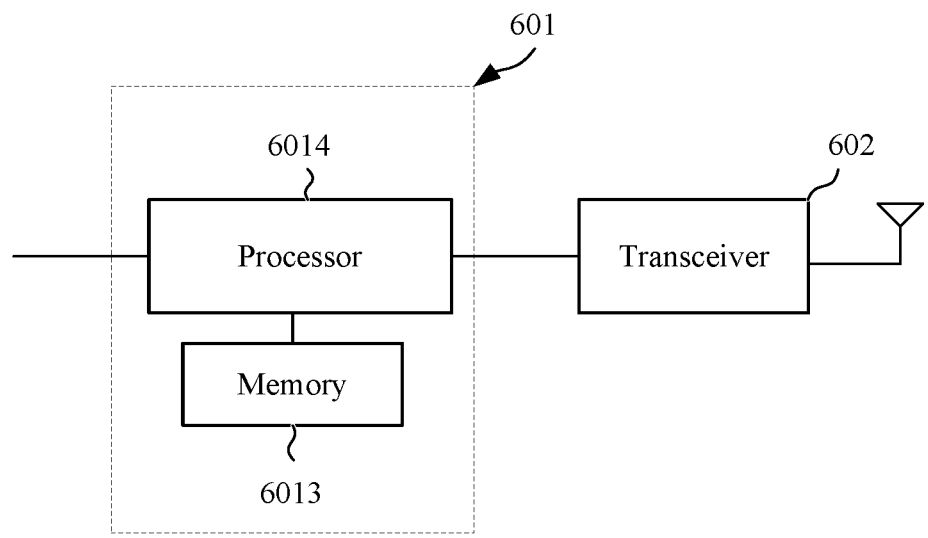
FIG. 8 is a schematic structural diagram of a processing apparatus according to an embodiment of this application.

When the processing apparatus 601 is implemented by software, referring to FIG. 8, the processing apparatus 601 includes:

a memory 6013, configured to store a program; and a processor 6014, configured to execute the program stored in the memory, and when the program is executed, perform the foregoing method.

Figure 9:
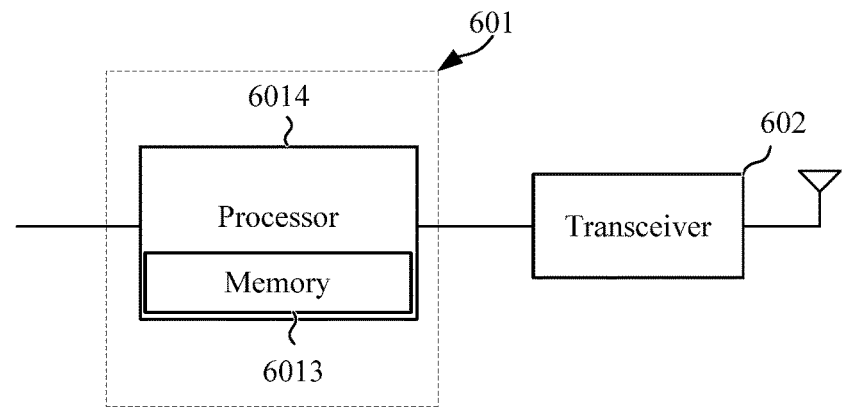
FIG. 9 is a schematic structural diagram of a processing apparatus according to an embodiment of this application.

The memory 6013 may be a physically independent unit, or may be integrated with the processor 6014. For details, refer to FIG. 9.

The processor 6014 may be configured to perform the coding method shown in FIG. 4. For details, refer to the descriptions in Embodiment 1, Embodiment 2, and Embodiment 3 in the foregoing method embodiments. Details are not described again herein.

Figure 10:
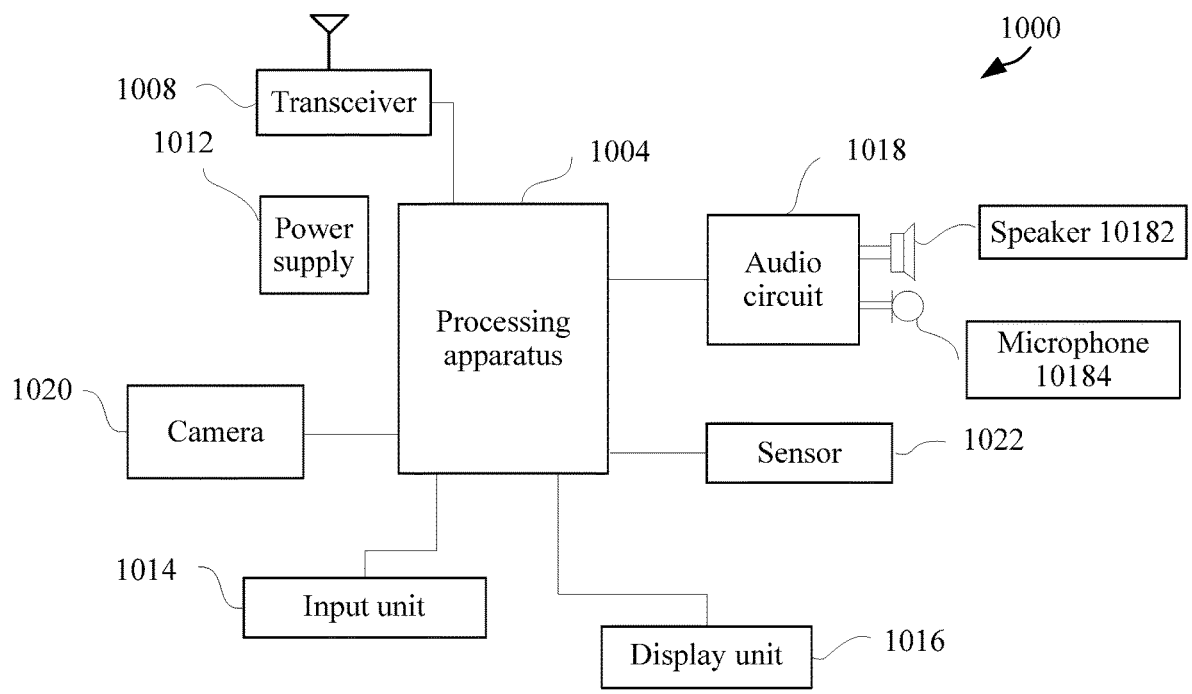
FIG. 10 is a schematic structural diagram of another embodiment of a communications device according to an embodiment of this application.

The communications device may be a terminal or may be a network device. When the communications device is a terminal, referring to FIG. 10, the terminal 1000 may further include a power supply 1012, configured to supply power for each component or circuit in the terminal; and the terminal may further include an antenna 1010, configured to transmit, by using a radio signal, uplink data output by a transceiver, or output a received radio signal to a transceiver.

In addition, to make functions of the terminal more complete, the terminal may further include one or more of an input unit 1014, a display unit 1016, an audio circuit 1018, a camera 1020, and a sensor 1022, where the audio circuit may include a speaker 10182, a microphone 10184, and the like.

An embodiment of this application further provides a computer storage medium, configured to store a computer software instruction of the foregoing communications device, where the computer software instruction is used to perform the method in the method embodiment.

With reference to the foregoing descriptions, a person skilled in the art may be aware that, the methods of the embodiments in the specification may be implemented by hardware (for example, a logic circuit), or software, or a combination of hardware and software. Whether the functions are performed by hardware or software depends on particular applications and design constraints of the technical solutions. A person skilled in the art may use different methods to implement the described functions for each particular application, but it should not be considered that the implementation goes beyond the scope of this application.

When functions are implemented in a form of software and sold or used as an independent product, the functions may be stored in a computer-readable storage medium. In this case, the technical solutions of this application essentially, or the part contributing to the prior art, or some of the technical solutions may be implemented in a form of a computer software product. The computer software product is stored in a storage medium, and includes several instructions for instructing a computer device (which may be a personal computer, a server, a network device, or the like) to perform all or some of the operations of the methods described in the embodiments of this application. The foregoing storage medium includes any medium that can store program code, such as a USB flash drive, a removable hard disk, a read-only memory (ROM), a random access memory (RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A coding method, comprising:
   obtaining an input information bit sequence;
   constructing at least one check equation based on a correspondence between a first subchannel and a second subchannel that is in a second subchannel group, wherein a check bit of the check equation corresponds to the first subchannel, an information bit of the check equation corresponds to the second subchannel, the second subchannel group comprises at least one second subchannel, a sequence number of the first subchannel is divided by a first preset value and a remainder is a second preset value, a sequence number of the second subchannel is divided by a third preset value and a remainder is a fourth preset value, and the sequence number of the first subchannel is greater than the sequence number of the second subchannel;
   performing coding on the input information bit sequence by using the check equation to obtain a coded sequence, wherein the first preset value and the third preset value are non-zero;
   outputting the coded sequence to a transceiver; and
   transmitting the outputted coded sequence on a transmission signal.

2. The coding method according to claim 1, wherein constructing at least one check equation based on the correspondence between the first subchannel and the second subchannel that is in the second subchannel group comprises:
   dividing a sequence number of each subchannel in a plurality of subchannels by the first preset value to obtain a plurality of first remainders corresponding to sequence numbers of the plurality of subchannels, and dividing the sequence number of each subchannel in the plurality of subchannels by the third preset value to obtain a plurality of second remainders corresponding to the sequence numbers of the plurality of subchannels;
   determining a subchannel corresponding to a first remainder that is in the plurality of first remainders and equal to the second preset value as the first subchannel, and determining a subchannel corresponding to a second remainder that is in the plurality of second remainders and equal to the fourth preset value as the second subchannel;
   setting a correspondence between the first subchannel and the check bit, and setting a correspondence between the second subchannel and the information bit; and
   constructing the check equation based on a correspondence between the first subchannel corresponding to the check bit and the second subchannel corresponding to the information bit.

3. The coding method according to claim 1, wherein the first preset value is 2 raised to the power of n, the third preset value is 2 raised to the power of m, and m and n are positive integers.

4. The coding method according to claim 1, wherein
   the first preset value is 8, the second preset value is 1, the third preset value is 8, and the fourth preset value is 6;
   the first preset value is 8, the second preset value is 2, the third preset value is 8, and the fourth preset value is 5;
   the first preset value is 16, the second preset value is 1, the third preset value is 16, and the fourth preset value comprises 10, 12, and 14;
   the first preset value is 16, the second preset value is 2, the third preset value is 16, and the fourth preset value comprises 12 and 13;
   the first preset value is 16, the second preset value is 3, the third preset value is 16, and the fourth preset value comprises 12, 13, and 14; or
   the first preset value is 16, the second preset value is 5, the third preset value is 16, and the fourth preset value is 14.

5. The coding method according to claim 1, wherein
   in the operation of constructing at least one check equation based on the correspondence between the first subchannel and the second subchannel that is in the second subchannel group, the first subchannel is a subchannel corresponding to the information bit, and in the operation of performing coding by using the check equation, the first subchannel is set as a subchannel corresponding to the check bit; and a subchannel that is in the second subchannel group and corresponds to a frozen bit is set as a subchannel corresponding to the information bit.

6. The coding method according to claim 5, wherein
   a difference between a maximum value of a sequence number of a second subchannel in the second subchannel group and the sequence number of the first subchannel is less than or equal to a fifth preset value.

7. The coding method according to claim 6, wherein the fifth preset value is 3, 5, 7, or 9.

8. The coding method according to claim 1, wherein in the operation of constructing at least one check equation based on the correspondence between the first subchannel and the second subchannel that is in the second subchannel group, a quantity of constructed check equations is X, and the performing coding by using the check equation comprises:
calculating an average value of reliability of subchannels corresponding to information bits of each check equation;
selecting Y check equations from the X check equations, wherein the average value of reliability corresponding to each of the Y check equations is less than the average value of reliability corresponding to each of (X−Y) check equations, and the (X−Y) check equations are remaining check equations after the Y check equations are selected from the X check equations; and
performing coding by using the Y check equations.

9. A communications device, comprising:
a memory configured to store a program;
a processor configured to execute the program stored in the memory, wherein when the program is executed the processor performs a method including:
obtaining an input information bit sequence;
constructing at least one check equation based on a correspondence between a first subchannel and a second subchannel that is in a second subchannel group, wherein a check bit of the check equation corresponds to the first subchannel, an information bit of the check equation corresponds to the second subchannel, the second subchannel group comprises at least one second subchannel, a sequence number of the first subchannel is divided by a first preset value and a remainder is a second preset value, a sequence number of the second subchannel is divided by a third preset value and a remainder is a fourth preset value, and the sequence number of the first subchannel is greater than the sequence number of the second subchannel;
performing coding on the input information bit sequence by using the check equation constructed by the processor to obtain a coded sequence, wherein the first preset value and the third preset value are non-zero; and
outputting the coded sequence to a transceiver; and
wherein the transceiver is configured to transmit the outputted coded sequence on a transmission signal.

10. The communications device according to claim 9, wherein the processor is further configured to:
divide a sequence number of each subchannel in a plurality of subchannels by the first preset value to obtain a plurality of first remainders corresponding to sequence numbers of the plurality of subchannels, and divide the sequence number of each subchannel in the plurality of subchannels by the third preset value to obtain a plurality of second remainders corresponding to the sequence numbers of the plurality of subchannels;
determine a subchannel corresponding to a first remainder that is in the plurality of first remainders and equal to the second preset value as the first subchannel, and determine a subchannel corresponding to a second remainder that is in the plurality of second remainders and equal to the fourth preset value as the second subchannel;
set a correspondence between the first subchannel and the check bit, and set a correspondence between the second subchannel and the information bit; and
construct the check equation based on a correspondence between the first subchannel corresponding to the check bit and the second subchannel corresponding to the information bit.

11. The communications device according to claim 10, wherein the first preset value is 2 raised to the power of n, the third preset value is 2 raised to the power of m, and m and n are positive integers.

12. The communications device according to claim 11, wherein
the first preset value is 8, the second preset value is 1, the third preset value is 8, and the fourth preset value is 6; or
the first preset value is 8, the second preset value is 2, the third preset value is 8, and the fourth preset value is 5; or
the first preset value is 16, the second preset value is 1, the third preset value is 16, and the fourth preset value comprises 10, 12, and 14; or
the first preset value is 16, the second preset value is 2, the third preset value is 16, and the fourth preset value comprises 12 and 13; or
the first preset value is 16, the second preset value is 3, the third preset value is 16, and the fourth preset value comprises 12, 13, and 14; or
the first preset value is 16, the second preset value is 5, the third preset value is 16, and the fourth preset value is 14.

13. The communications device according to claim 12, wherein
when the processor constructs the check equation, the first subchannel is a subchannel corresponding to the information bit; and the processor is further configured to:
set the first subchannel as a subchannel corresponding to the check bit; and set a subchannel that is in the second subchannel group and corresponds to a frozen bit as a subchannel corresponding to the information bit.

14. The communications device according to claim 13, wherein
a difference between a maximum value of a sequence number of a second subchannel in the second subchannel group and the sequence number of the first subchannel is less than or equal to a fifth preset value.

15. The communications device according to claim 14, wherein the fifth preset value is 3, 5, 7, or 9.

16. The communications device according to claim 15, wherein at least one check equation constructed by the processor is X, and the processor is further configured to:
calculate an average value of reliability of subchannels corresponding to information bits of each check equation;
select Y check equations from the X check equations, wherein the average value of reliability corresponding to each of the Y check equations is less than the average value of reliability corresponding to each of (X−Y) check equations, and the (X−Y) check equations are remaining check equations after the Y check equations are selected from the X check equations; and
perform coding by using the Y check equations.

17. A non-transitory computer storage medium, configured to store a computer software instruction, wherein the computer software instruction, when executed by a processor, performs a coding method comprising:
obtaining an input information bit sequence;
constructing at least one check equation based on a correspondence between a first subchannel and a second subchannel that is in a second subchannel group, wherein a check bit of the check equation corresponds to the first subchannel, an information bit of the check equation corresponds to the second subchannel, the second subchannel group comprises at least one second subchannel, a sequence number of the first subchannel is divided by a first preset value and a remainder is a second preset value, a sequence number of the second subchannel is divided by a third preset value and a remainder is a fourth preset value, and the sequence number of the first subchannel is greater than the sequence number of the second subchannel; and performing coding on the input information bit sequence by using the check equation to obtain a coded sequence, wherein the first preset value and the third preset value are non-zero;

outputting the coded sequence to a transceiver; and transmitting the outputted coded sequence on a transmission signal.

18. The non-transitory computer storage medium of claim 17, wherein constructing at least one check equation based on the correspondence between the first subchannel and the second subchannel that is in the second subchannel group comprises:

dividing a sequence number of each subchannel in a plurality of subchannels by the first preset value to obtain a plurality of first remainders corresponding to sequence numbers of the plurality of subchannels, and dividing the sequence number of each subchannel in the plurality of subchannels by the third preset value to obtain a plurality of second remainders corresponding to the sequence numbers of the plurality of subchannels;

determining a subchannel corresponding to a first remainder that is in the plurality of first remainders and equal to the second preset value as the first subchannel, and determining a subchannel corresponding to a second remainder that is in the plurality of second remainders and equal to the fourth preset value as the second subchannel;

setting a correspondence between the first subchannel and the check bit, and setting a correspondence between the second subchannel and the information bit; and constructing the check equation based on a correspondence between the first subchannel corresponding to the check bit and the second subchannel corresponding to the information bit.

19. The non-transitory computer storage medium of claim 17, wherein the first preset value is 2 raised to the power of n, the third preset value is 2 raised to the power of m, and m and n are positive integers.

20. The non-transitory computer storage medium of claim 17, wherein the first preset value is 8, the second preset value is 1, the third preset value is 8, and the fourth preset value is 6;

the first preset value is 8, the second preset value is 2, the third preset value is 8, and the fourth preset value is 5;

the first preset value is 16, the second preset value is 1, the third preset value is 16, and the fourth preset value comprises 10, 12, and 14;

the first preset value is 16, the second preset value is 2, the third preset value is 16, and the fourth preset value comprises 12 and 13;

the first preset value is 16, the second preset value is 3, the third preset value is 16, and the fourth preset value comprises 12, 13, and 14; or the first preset value is 16, the second preset value is 5, the third preset value is 16, and the fourth preset value is 14.

\* \* \* \* \*